US008698663B2

(12) United States Patent
Smiley et al.

(10) Patent No.: US 8,698,663 B2
(45) Date of Patent: Apr. 15, 2014

(54) DIGITAL ANALOG CONVERTER

(75) Inventors: Russell Clifford Smiley, Richmond (CA); Mark Wyville, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 19 days.

(21) Appl. No.: 13/597,371

(22) Filed: Aug. 29, 2012

(65) Prior Publication Data

US 2014/0062744 A1 Mar. 6, 2014

(51) Int. Cl.
*H03M 1/66* (2006.01)

(52) U.S. Cl.
USPC .......................................... 341/144; 341/145

(58) Field of Classification Search
USPC .................................................. 341/144, 145
See application file for complete search history.

(56) References Cited

U.S. PATENT DOCUMENTS

| 6,044,225 A * | 3/2000 | Spencer et al. ................. 710/52 |
| 2009/0195426 A1 | 8/2009 | Ballantyne |

FOREIGN PATENT DOCUMENTS

| DE | 102006048904 A1 | 4/2008 |
| EP | 1096688 A1 | 5/2001 |
| GB | 2203305 A | 10/1988 |

OTHER PUBLICATIONS

Orfanidis, S., "Introduction to Signal Processing," Pearson Education, Inc., 2010, 783 pages, http://www.ece.rutgers.edu/~orfanidi/intro2sp.

Proakis, J.G et al., "Digital Signal Processing, Principles, Algorithms, and Applications," 3rd Edition, Prentice-Hall, Oct. 1995, pp. 620-667; 700-725.

Domanin, D., et al., "A Multipath Polyphase Digital-to-Analog Converter for Software Radio Transmission Systems," IEEE International Symposium on Circuits and Systems, vol. 2, May 28-31, 2000, Geneva, Switzerland, pp. 361-364.

Jha, A., et al., "Wideband Signal Synthesis Using Interleaved Partial-Order Hold Current-Mode Digital-to-Analog Converters," IEEE Transactions on Circuits and Systems—II: Express Briefs, vol. 55, No. 11, Nov. 2008, pp. 1109-1113.

International Search Report and Written Opinion for PCT/IB2013/056156 mailed Feb. 18, 2014, 17 pages.

* cited by examiner

*Primary Examiner* — Jean B Jeanglaude

(74) *Attorney, Agent, or Firm* — Withrow & Terranova, PLLC

(57) ABSTRACT

Embodiments of a digital-to-analog conversion system that utilizes a specialized clock signal to reshape an analog impulse response of a digital-to-analog converter (DAC) are disclosed. Preferably, a shape of the specialized clock signal is such that Nyquist images resulting from digital-to-analog conversion are controlled in a desired manner. In one embodiment, the digital-to-analog conversion system includes a DAC that converts a digital input signal into an analog output signal. A specialized clock signal is applied to the analog output signal of the DAC such that an analog impulse response of the DAC is reshaped according to a shape of the specialized clock signal, thereby providing a modified analog output signal. The specialized clock signal reshapes the analog impulse response of the DAC such that Nyquist images resulting from digital-to-analog conversion are controlled in a desired manner.

44 Claims, 22 Drawing Sheets

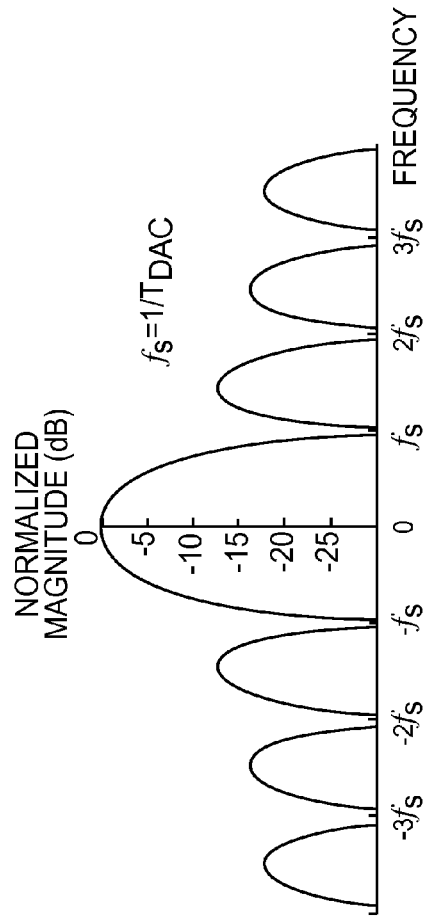
FIG. 8A
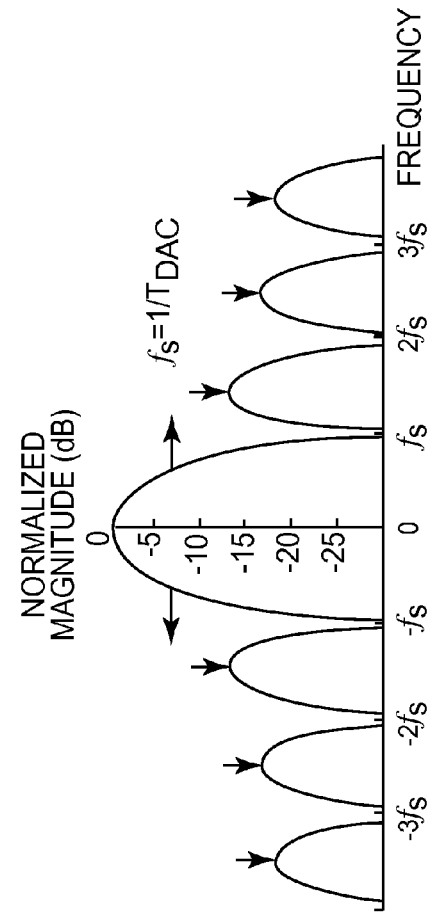
FIG. 8B
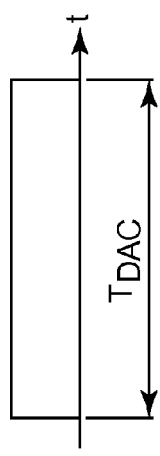
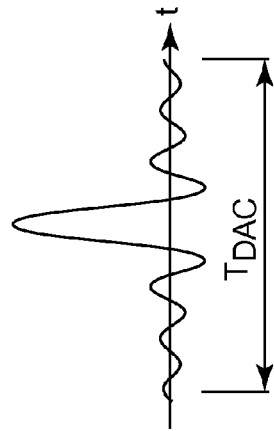

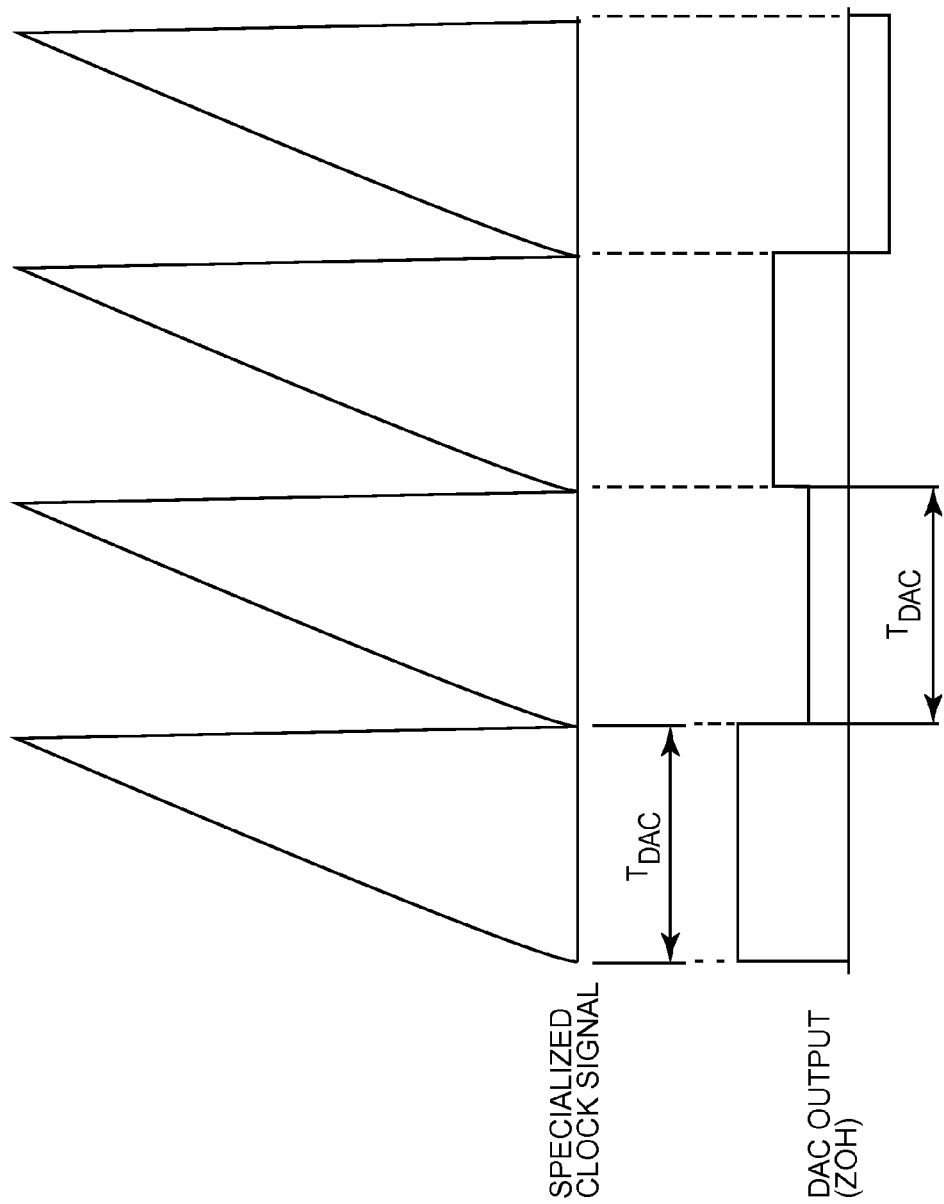

ly integrate the DAC and frequency up-conversion functions into a single integrated chip. The low-pass filters required in all of the above approaches do not integrate well onto an integrated chip due to their large area and precision issues related to passive devices. In order to integrate the DAC and frequency up-conversion functions, all undesired Nyquist images at the DAC output need to be significantly attenuated with a small integrated low-pass filter (small size corresponds to poor selectivity), or no filter at all. There are two issues if the undesired Nyquist images are not significantly attenuated. First, due to the specific frequency spacing of the Nyquist images, non-linear action in the up-conversion mixer will result in intermodulation distortion (IMD) falling directly into the passband. Second the Nyquist images and their IMD components outside the passband need to be filtered after up-conversion by a highly selective radio frequency (RF) band-pass filter, which is typically larger and more complex than the low-pass filter it is replacing.

DIGITAL ANALOG CONVERTER

FIELD OF THE DISCLOSURE

The present disclosure relates to a digital-to-analog converter (DAC) and more particularly relates to reshaping an analog impulse response of a DAC to control Nyquist images resulting from digital-to-analog conversion in a desired manner.

BACKGROUND

Digital-to-analog converters (DACs) are primary components in many of today's electronic devices. For example, modern telecommunication devices include digital processors to perform complex processing while adhering to reasonable power and size constraints. In order to wirelessly transmit information, digital signals output by the digital processors are converted into analog signals. This conversion process is performed by a DAC.

The frequency domain representation of a digital signal consists of an infinite number of replicas of the desired analog signal located at integer multiples of a sampling rate ($f_S$) of the digital signal, as illustrated in FIG. 1. These replicas are referred to herein as Nyquist images or simply images. Since the Nyquist images are undesirable after digital-to-analog conversion, several approaches have been developed to remove the Nyquist images in the analog domain, namely, analog low-pass filtering, interpolation, high-order sample-and-holds, and combining the output of multiple DACs that have offset clocks.

In this regard, FIG. 2 illustrates a DAC 10 followed by a low-pass filter 12. The low-pass filter 12 has a stop-band that starts at $f_S/2$ (see FIG. 1) such that the low-pass filter 12 removes all undesired Nyquist images while passing the desired signal centered at DC. The passband of the low-pass filter 12 must be as large as the desired signal bandwidth. If the bandwidth of the desired signal is close to $f_S/2$, like it is in FIG. 1, then there is a small region for the low-pass filter 12 to transition from passband to stopband. A short transition region requires that the low-pass filter 12 be highly selective, which means that the low-pass filter 12 must be physically large and is complex to design.

Interpolation in the digital domain can be used to increase the spacing between the Nyquist images in the frequency domain and thereby relax the selectivity requirements for the low-pass filter 12. Interpolation is equivalent to sampling a signal faster than the Nyquist rate, where the Nyquist rate is twice the baseband bandwidth of the signal. As illustrated in FIG. 3, as an example, interpolation may be used to increase the sampling rate of the digital signal of FIG. 1 by a factor of 4 to provide an increased sampling rate $f_S'$. By increasing the sampling rate by a factor of 4, the spacing between the Nyquist images has also been increased by a factor of 4, which in turn relaxes the selectivity requirements on the low-pass filter 12 (FIG. 2). As illustrated in FIG. 4, interpolation consists of up-sampling the digital signal by a desired up-sampling factor, which in this example is 4, using an up-sampler 14 and then digitally filtering the up-sampled digital signal with a Finite Impulse Response (FIR) filter 16. The resulting digital signal is then digital-to-analog converted by the DAC 10. However, the low-pass filter 12 is still required to remove the undesired Nyquist images.

Nyquist images are also affected by the manner in which the DAC 10 generates the analog signal. In particular, the manner in which the DAC 10 generates the analog signal shapes the effective frequency response at the analog output of the DAC 10. The analog output is typically characterized as zero-order hold (ZOH), first-order hold (FOH), second-order hold (SOH), etc. An analog signal with ZOH holds the value of the corresponding digital signal constant for one clock period, as illustrated in FIG. 5A. An analog signal with FOH generates a straight line between two consecutive digital values, as illustrated in FIG. 5B. An analog signal with SOH generates a quadratic curve between three consecutive digital values, as illustrated in FIG. 5C. The corresponding frequency response of the ZOH, FOH, and SOH type DACs are $\text{sinc}(\pi f/f_S)$, $\text{sinc}2(\pi f/f_S)$, and $\text{sinc}3(\pi f/f_S)$, respectively, where the sinc function is defined as $\text{sinc}(x)=\sin(x)/x$. These frequency responses exhibit nulls at the center of all undesired Nyquist images (i.e., have nulls at integer multiples of $f_S$). Each hold order requires a differentiator in the digital domain and an integrator in the analog domain. As an example, a SOH requires two digital differentiators and two analog integrators. The frequency response of the high-order holds is not flat over the desired signal's passband. As such, some form of compensation is required. In addition, high-order holds do not significantly relax the low-pass filter requirements since the frequency responses do not provide sufficient stop-band attenuation near $f_S/2$ (especially after compensation). However, high-order holds can be used with interpolation to relax the low-pass filter requirements. Interpolation confines more of the signal energy of the Nyquist images to the vicinity of the nulls of the high-order hold frequency responses.

Multiphase clocking involves summing the output of parallel DACs, whereby the clocks of each of the DACs are offset with respect to one another. Multiple DACs with different clock phases can be used to provide additional nulls in the frequency response. The same input signal is fed to all DACs. The additional nulls can be used to attenuate images beyond that achievable by the ZOH sinc response.

One problem with all of the aforementioned approaches to removing undesired Nyquist images is that all of the approaches require the low-pass filter 12. For future generations of mobile telecommunication device transmitters, it is desired to integrate the DAC and frequency up-conversion functions into a single integrated chip. The low-pass filters required in all of the above approaches do not integrate well onto an integrated chip due to their large area and precision issues related to passive devices. In order to integrate the DAC and frequency up-conversion functions, all undesired Nyquist images at the DAC output need to be significantly attenuated with a small integrated low-pass filter (small size corresponds to poor selectivity), or no filter at all. There are two issues if the undesired Nyquist images are not significantly attenuated. First, due to the specific frequency spacing of the Nyquist images, non-linear action in the up-conversion mixer will result in intermodulation distortion (IMD) falling directly into the passband. Second the Nyquist images and their IMD components outside the passband need to be filtered after up-conversion by a highly selective radio frequency (RF) band-pass filter, which is typically larger and more complex than the low-pass filter it is replacing.

As such, there is a need for systems and methods for attenuating undesired Nyquist images resulting from digital-to-analog conversion without the need for complex post-DAC analog filtering.

SUMMARY

The present disclosure relates to a digital-to-analog conversion system that utilizes a specialized clock signal to reshape an analog impulse response of a digital-to-analog converter (DAC). Preferably, a shape of the specialized clock signal is such that Nyquist images resulting from digital-to-analog conversion are controlled in a desired manner. In one embodiment, the digital-to-analog conversion system includes a DAC that converts a digital input signal into an analog output signal. The DAC is preferably a zero-order hold (ZOH) DAC, but is not limited thereto. A specialized clock signal is applied to the analog output signal of the DAC such that an analog impulse response of the DAC is reshaped according to a shape of the specialized clock signal, thereby providing a modified analog output signal. The specialized clock signal reshapes the analog impulse response of the DAC such that Nyquist images resulting from digital-to-analog conversion are controlled in a desired manner. Preferably, the specialized clock signal reshapes the analog impulse response of the DAC such that one or more undesired Nyquist images are attenuated.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
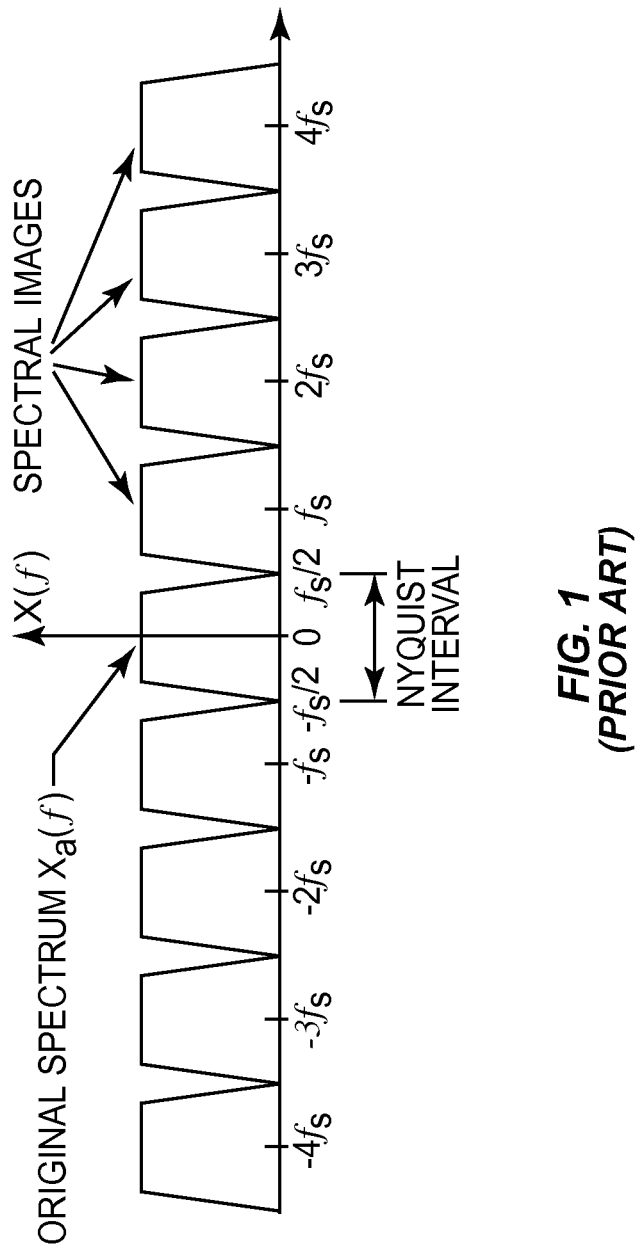
FIG. 1 illustrates a frequency domain representation of a digital signal showing Nyquist images.
Figure 2:
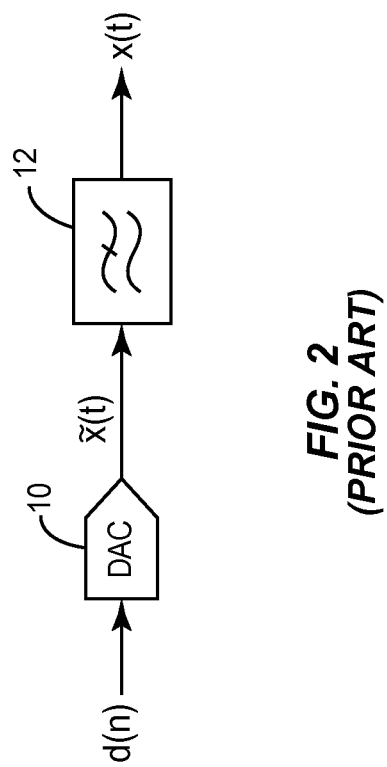
FIG. 2 illustrates a conventional digital-to-analog converter (DAC) followed by an analog low-pass filter that removes undesired Nyquist images.
Figure 3:
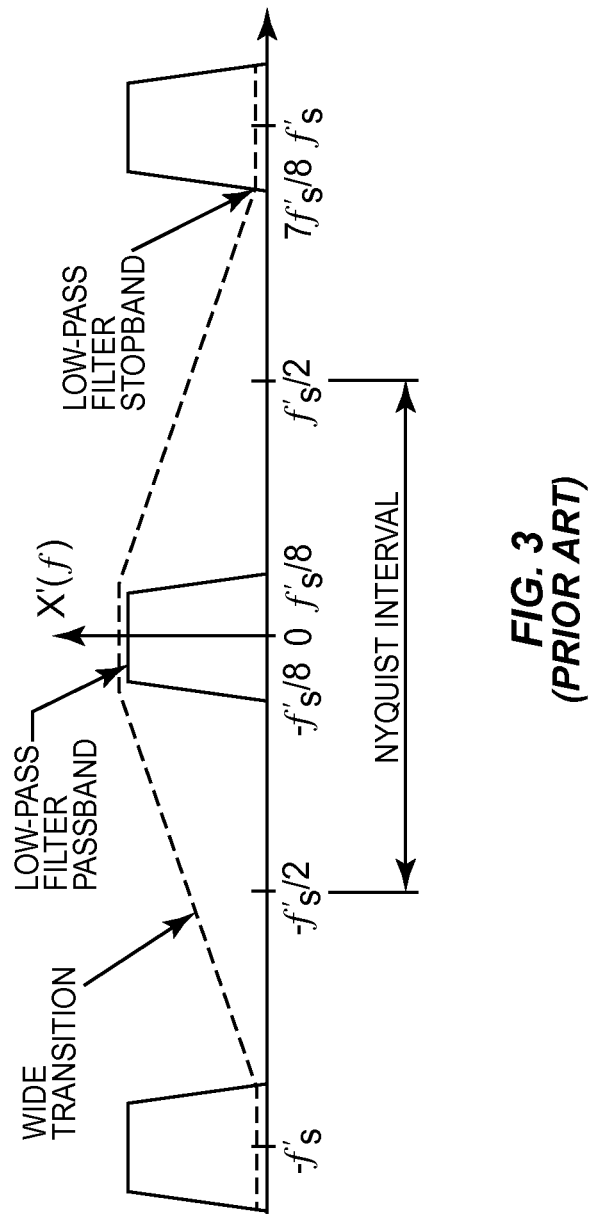
FIG. 3 illustrates a frequency domain representation of a digital signal after interpolation.
Figure 4:
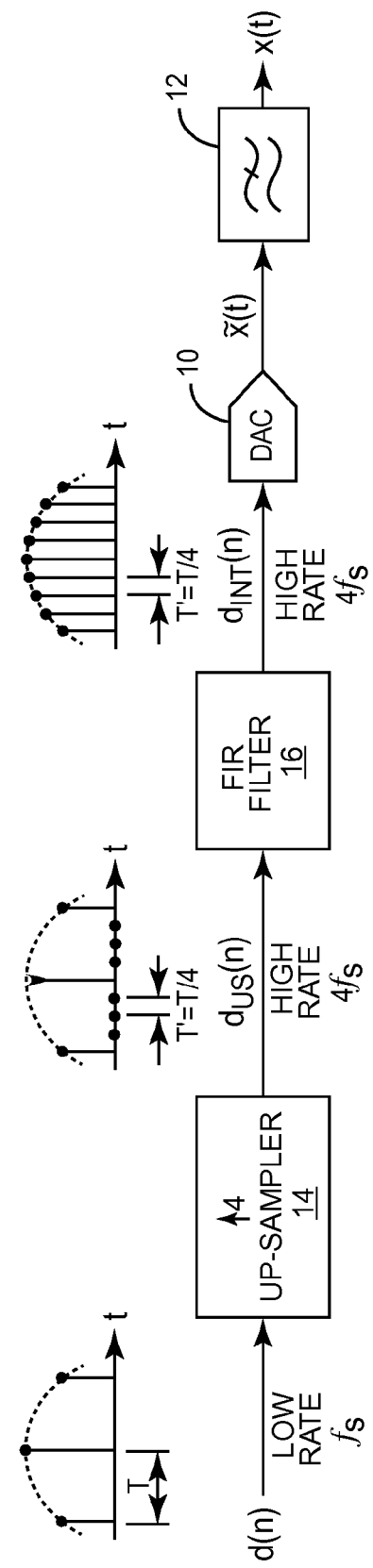
Figure 5A:
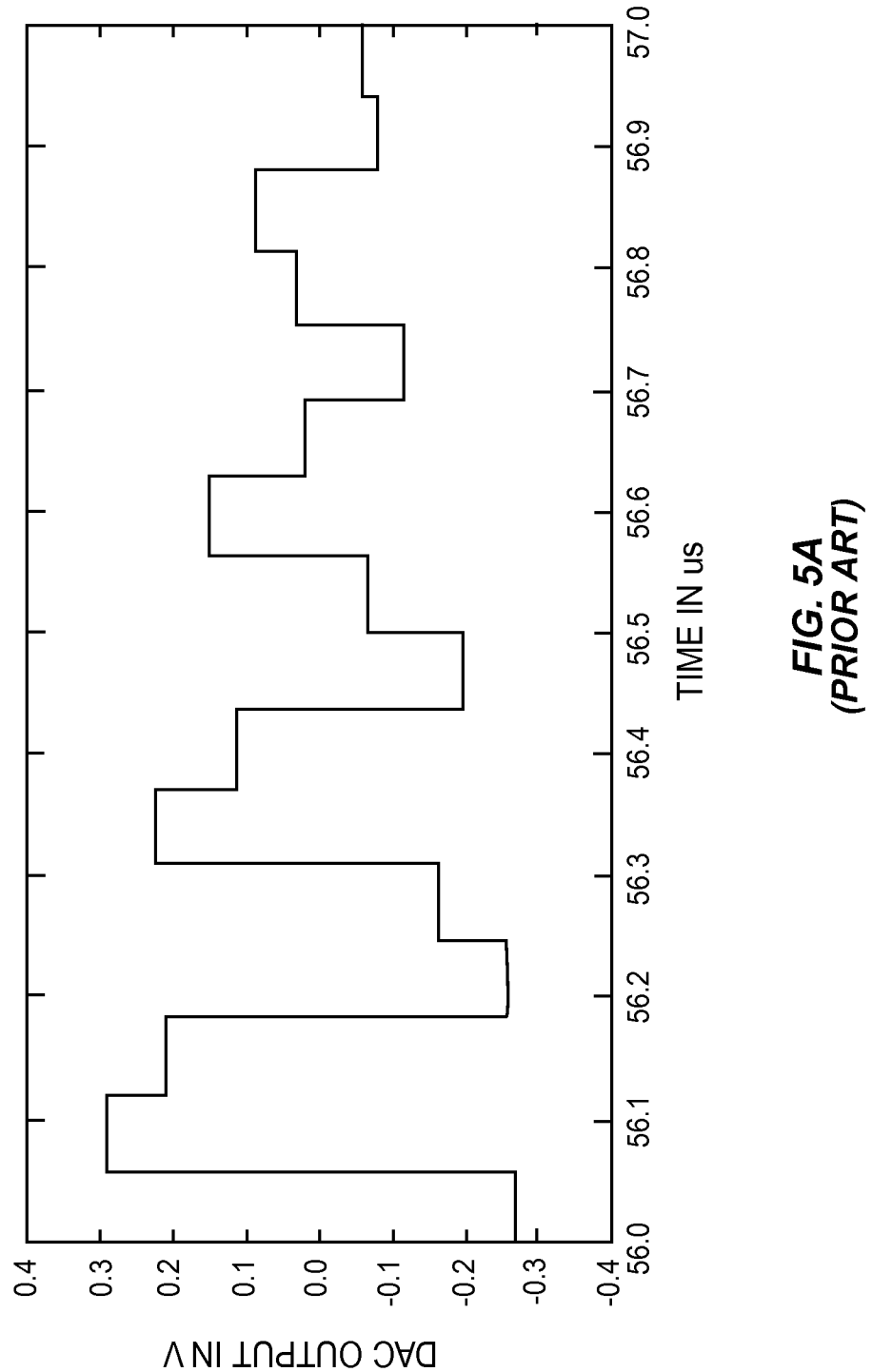
Figure 5B:
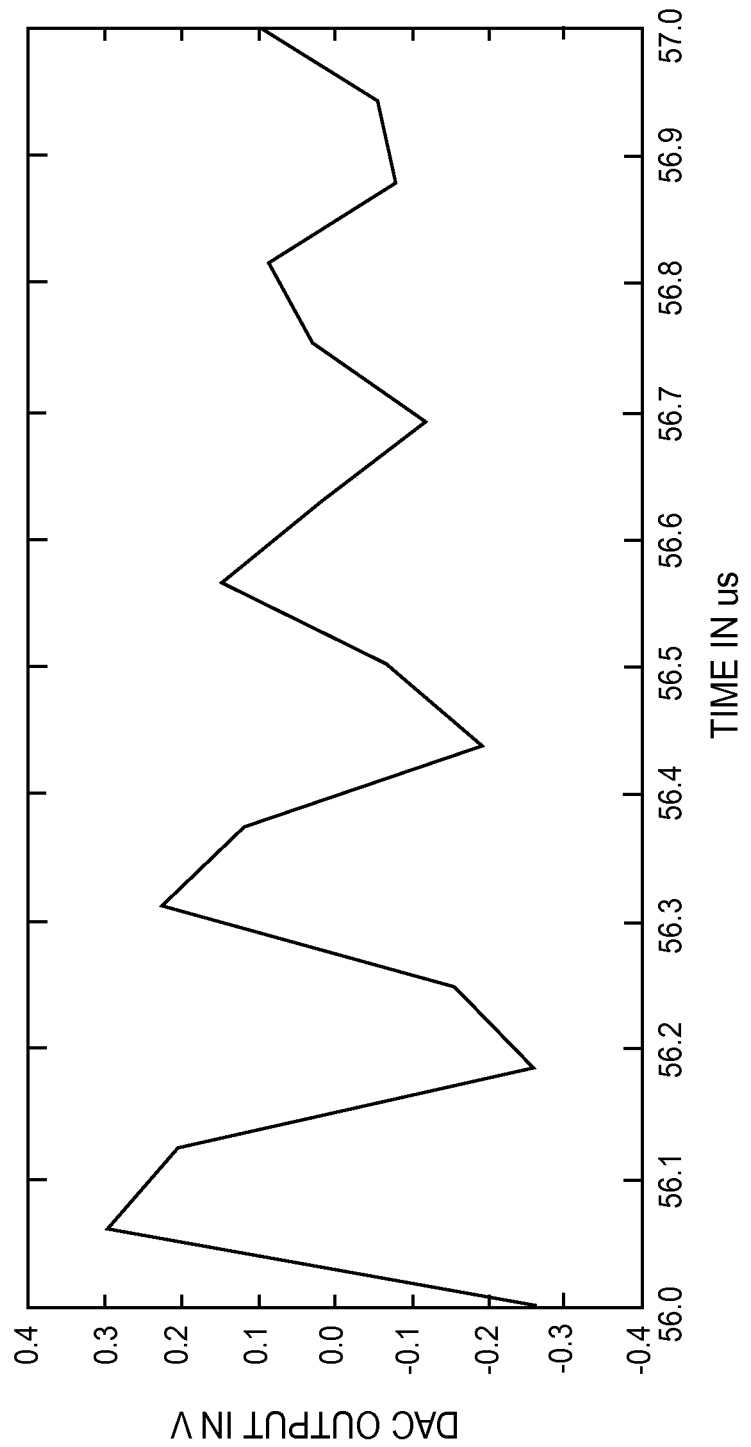
Figure 5C:
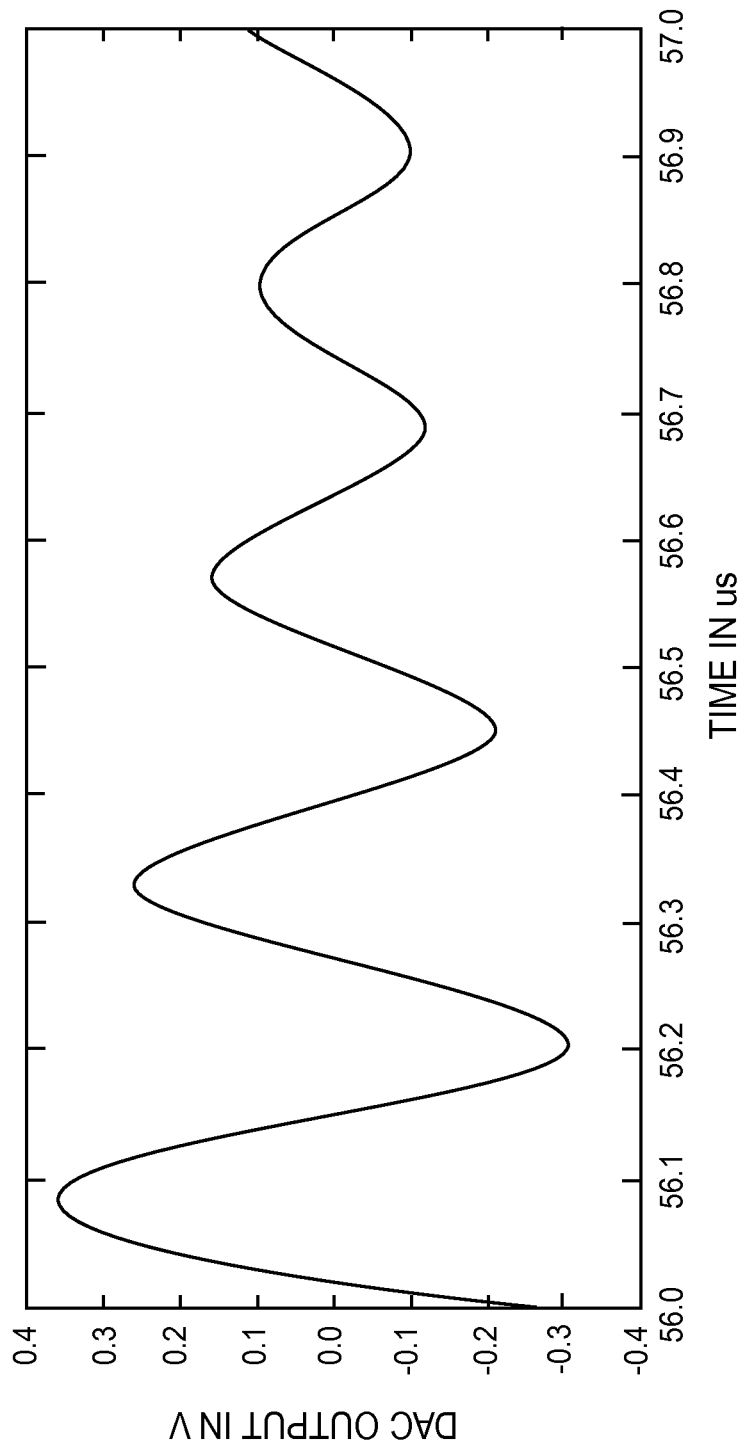
Figure 6:
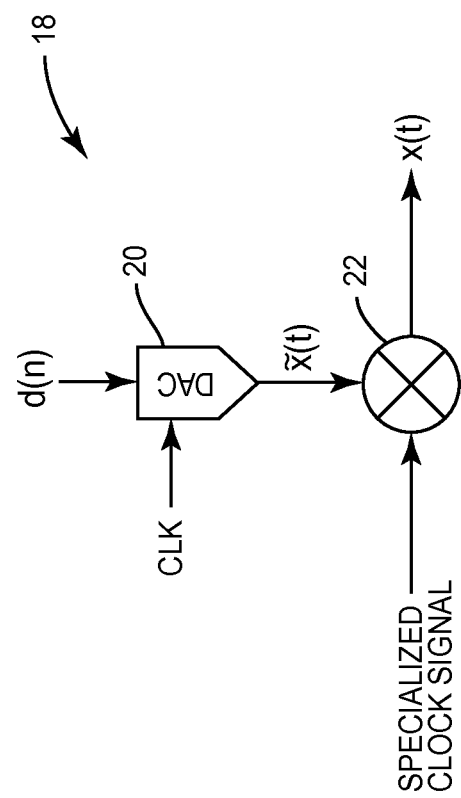
Figure 7:
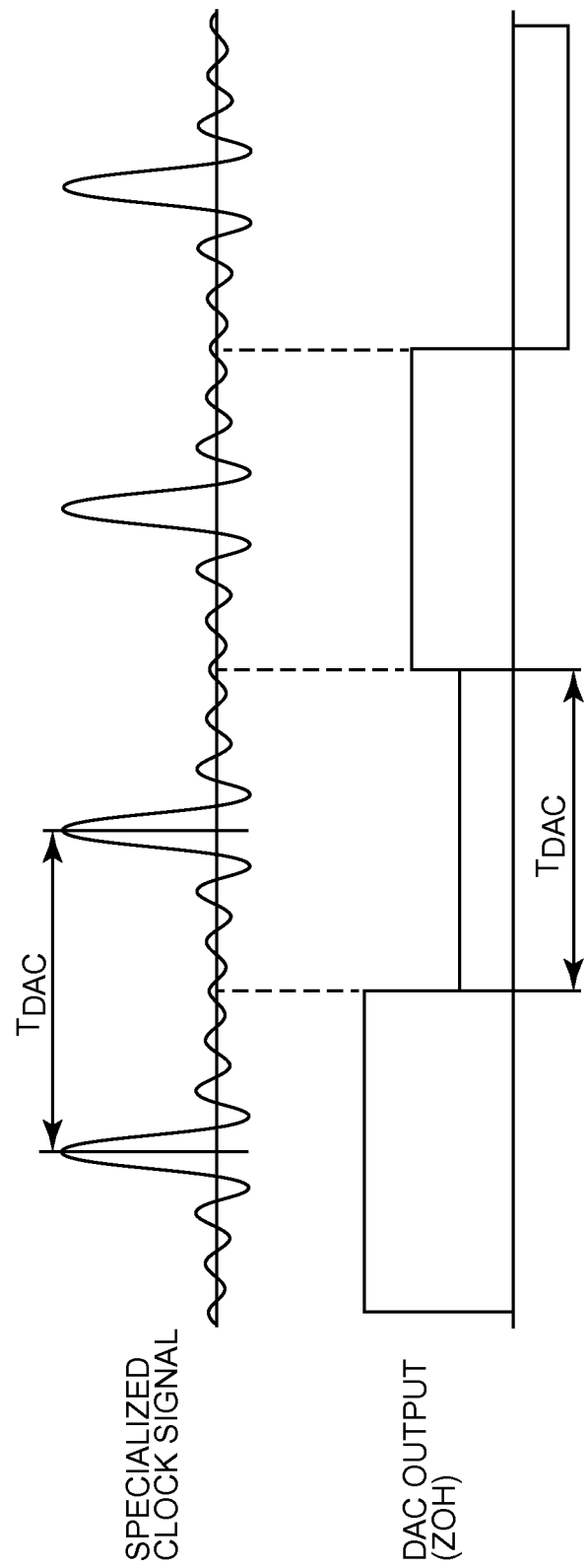
Figure 10A:
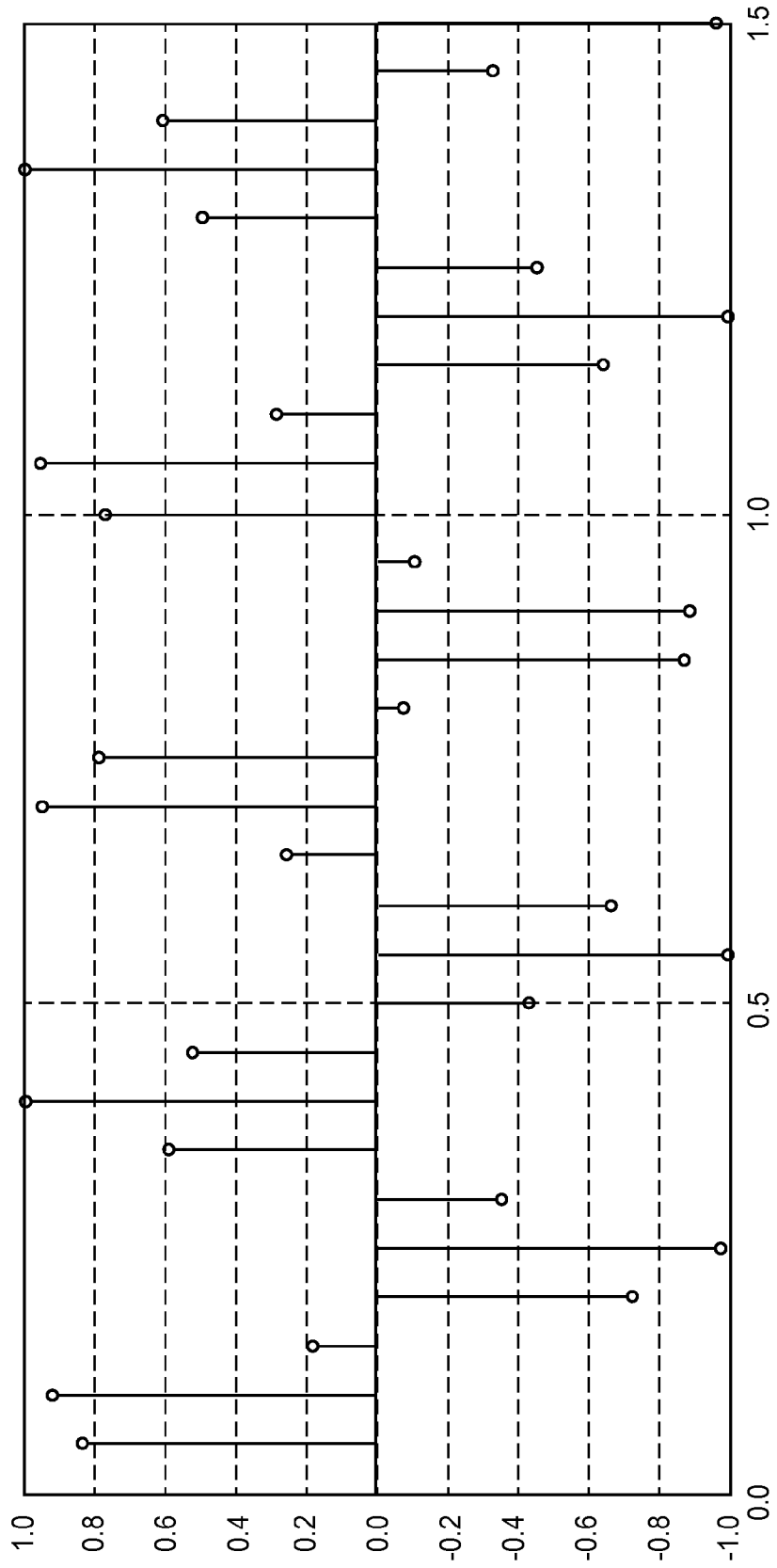
Figure 10B:
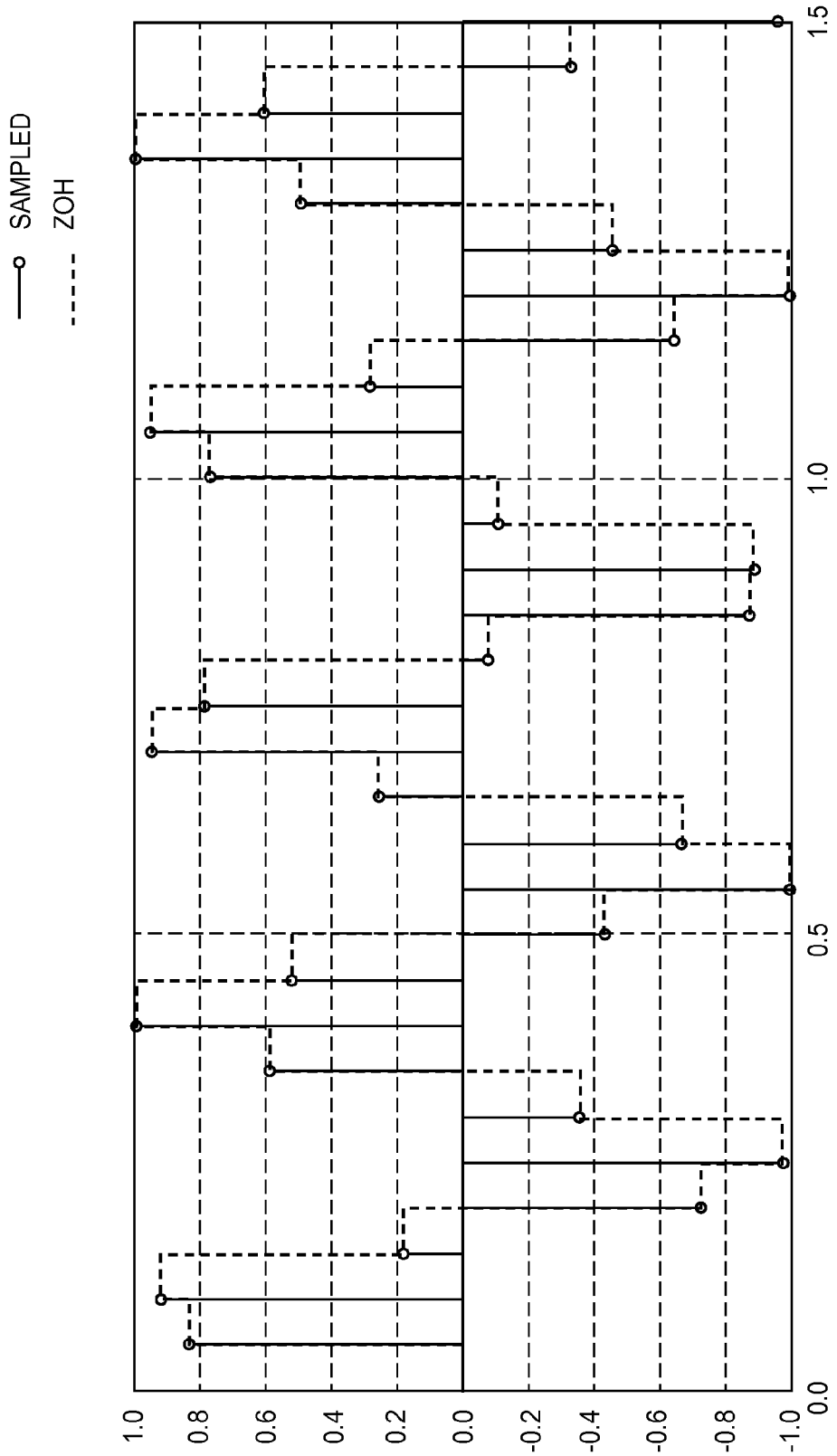
Figure 10C:
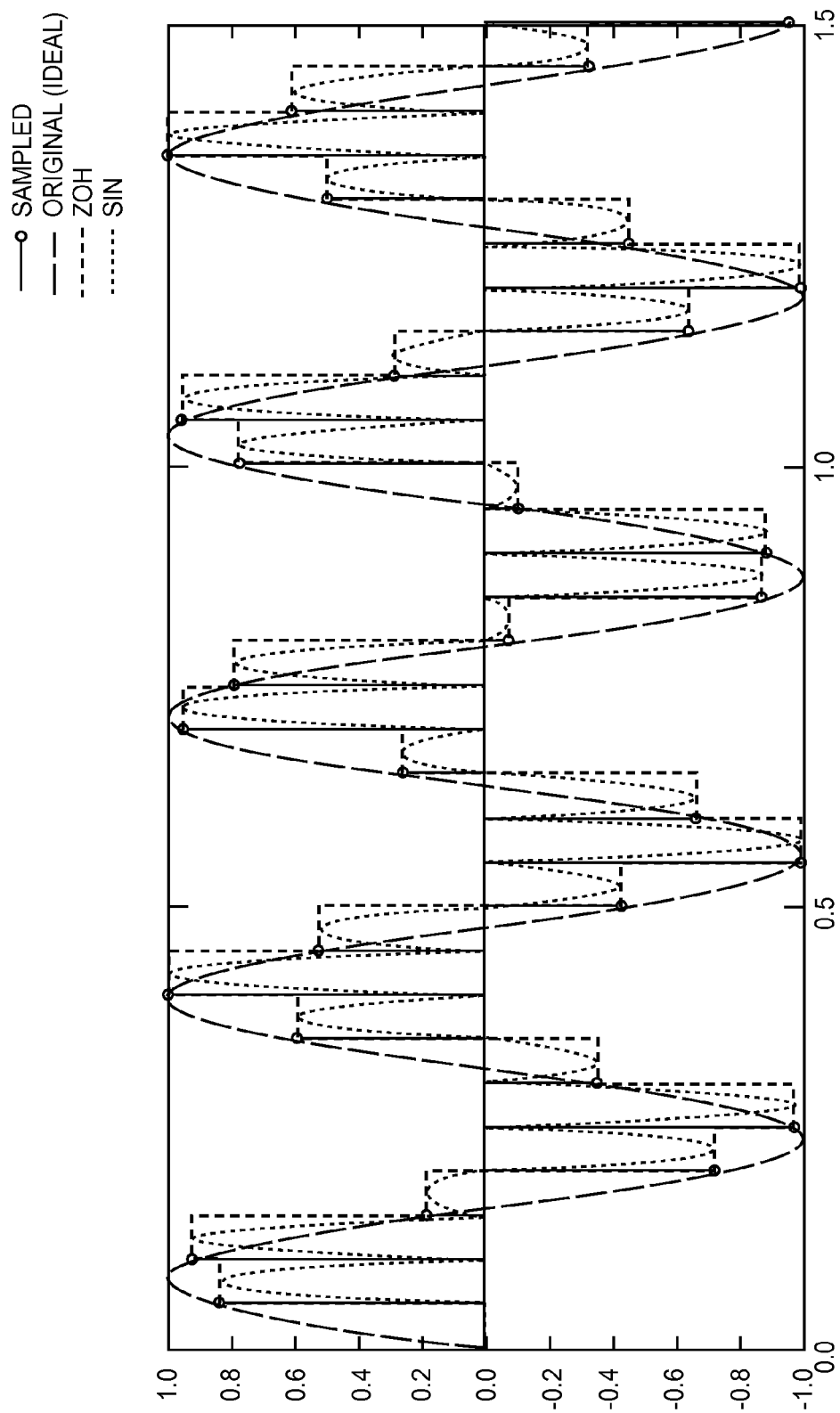
Figure 10D:
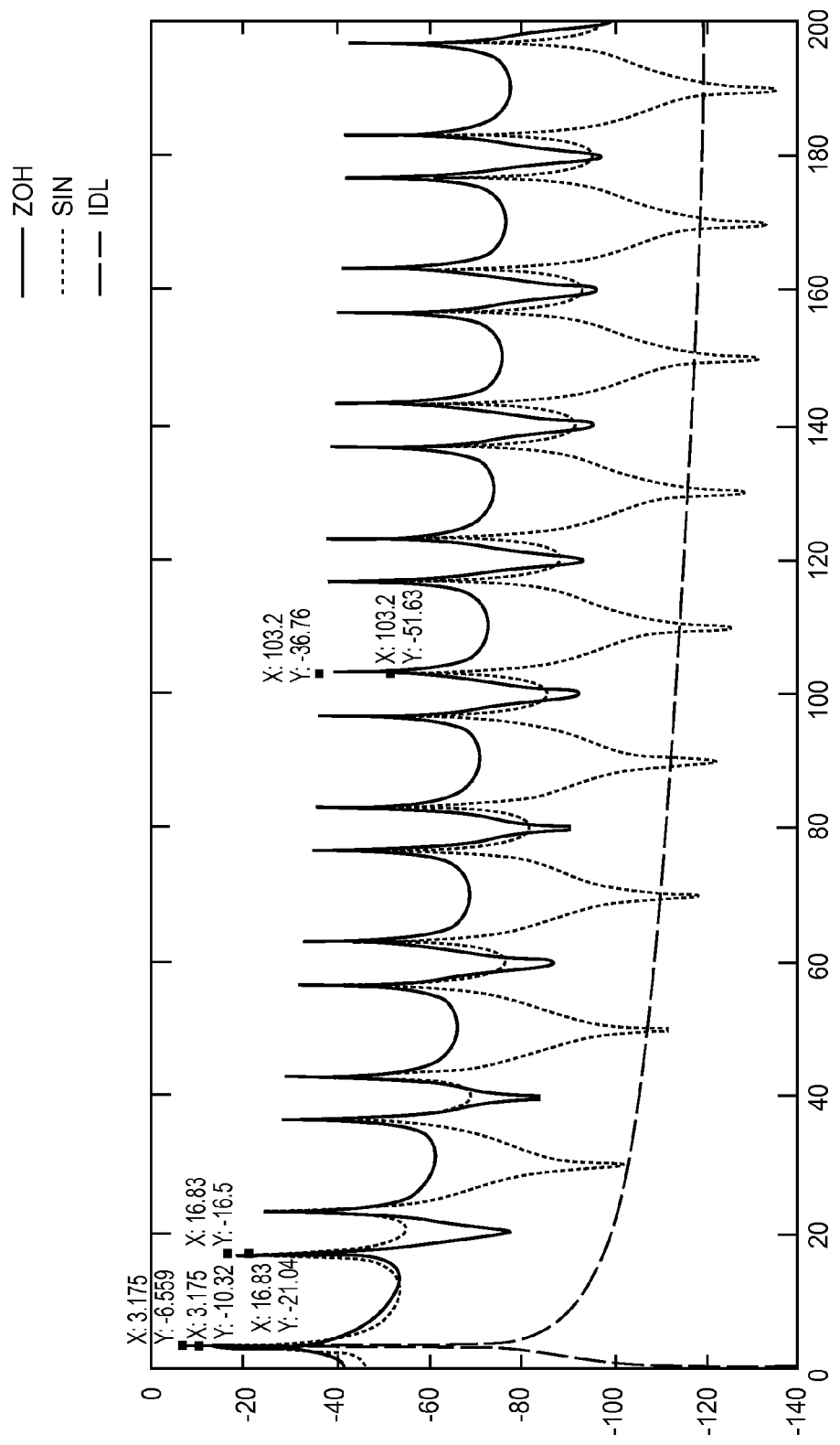
Figure 11:
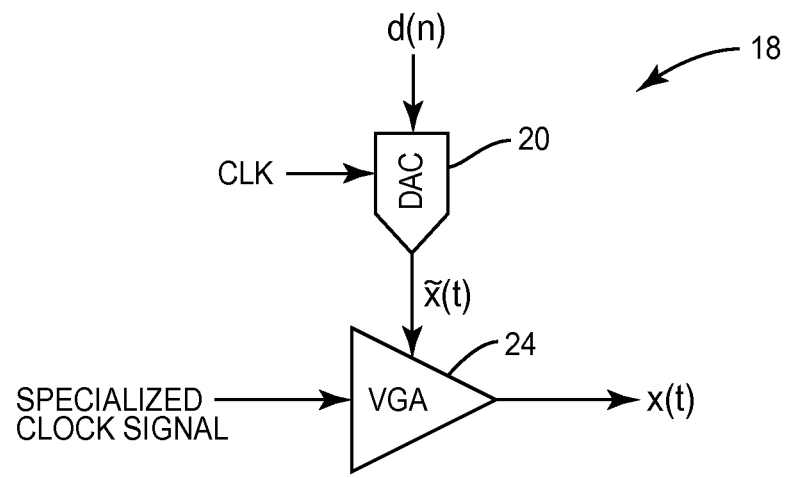
Figure 12:
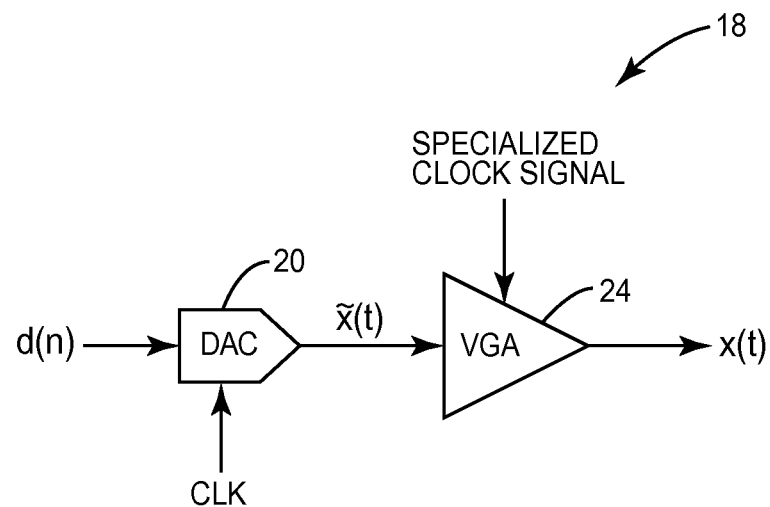
Figure 13:
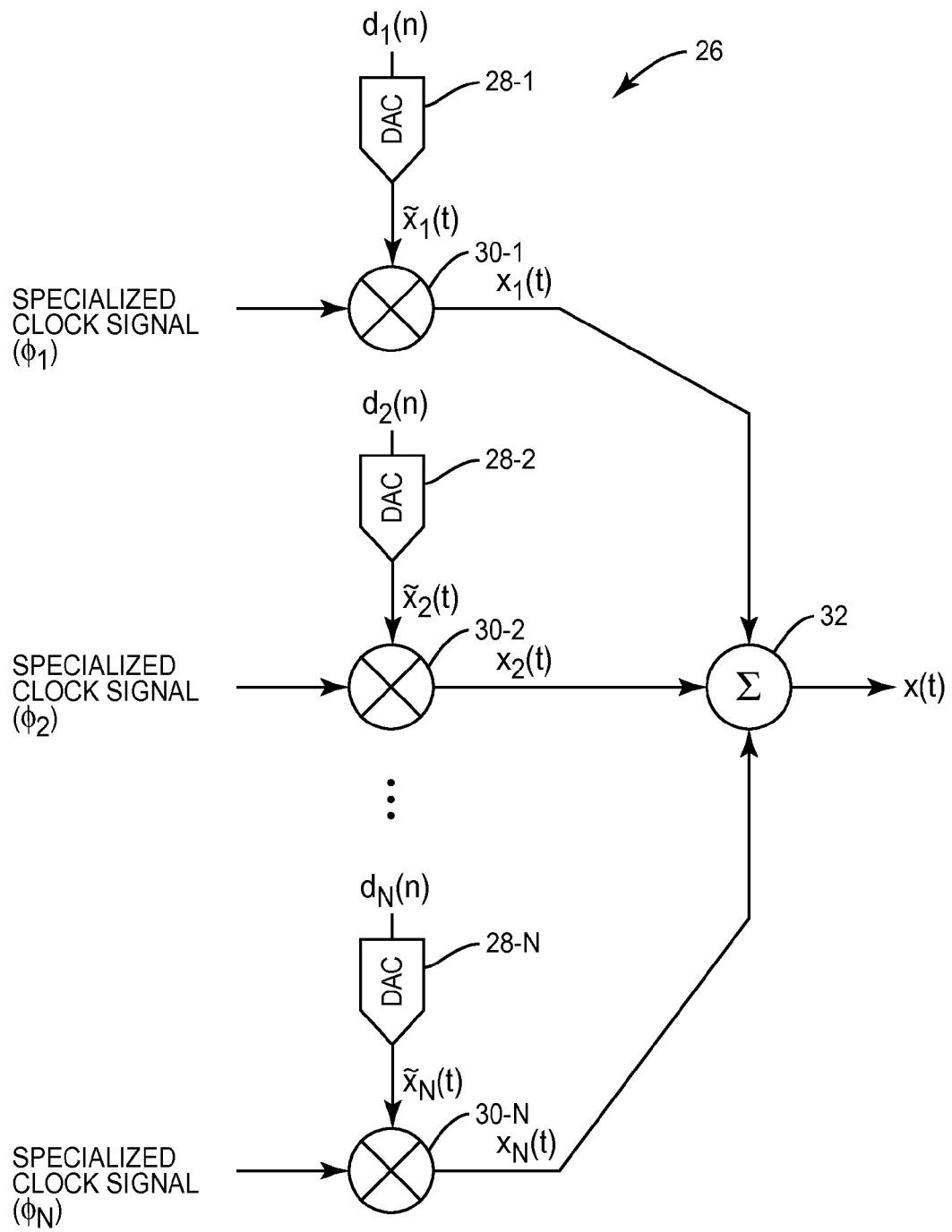
Figure 14:
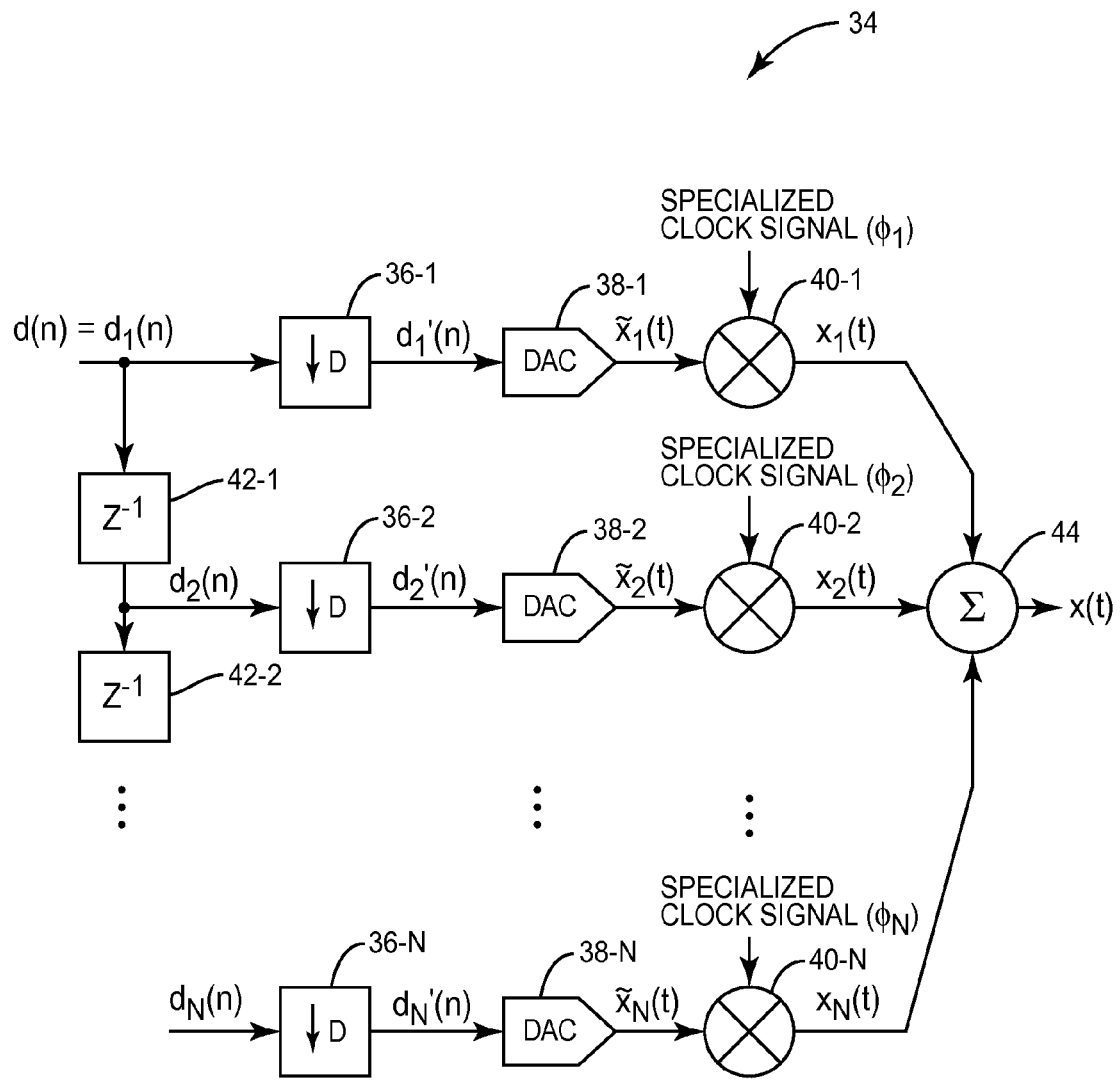
Figure 15:
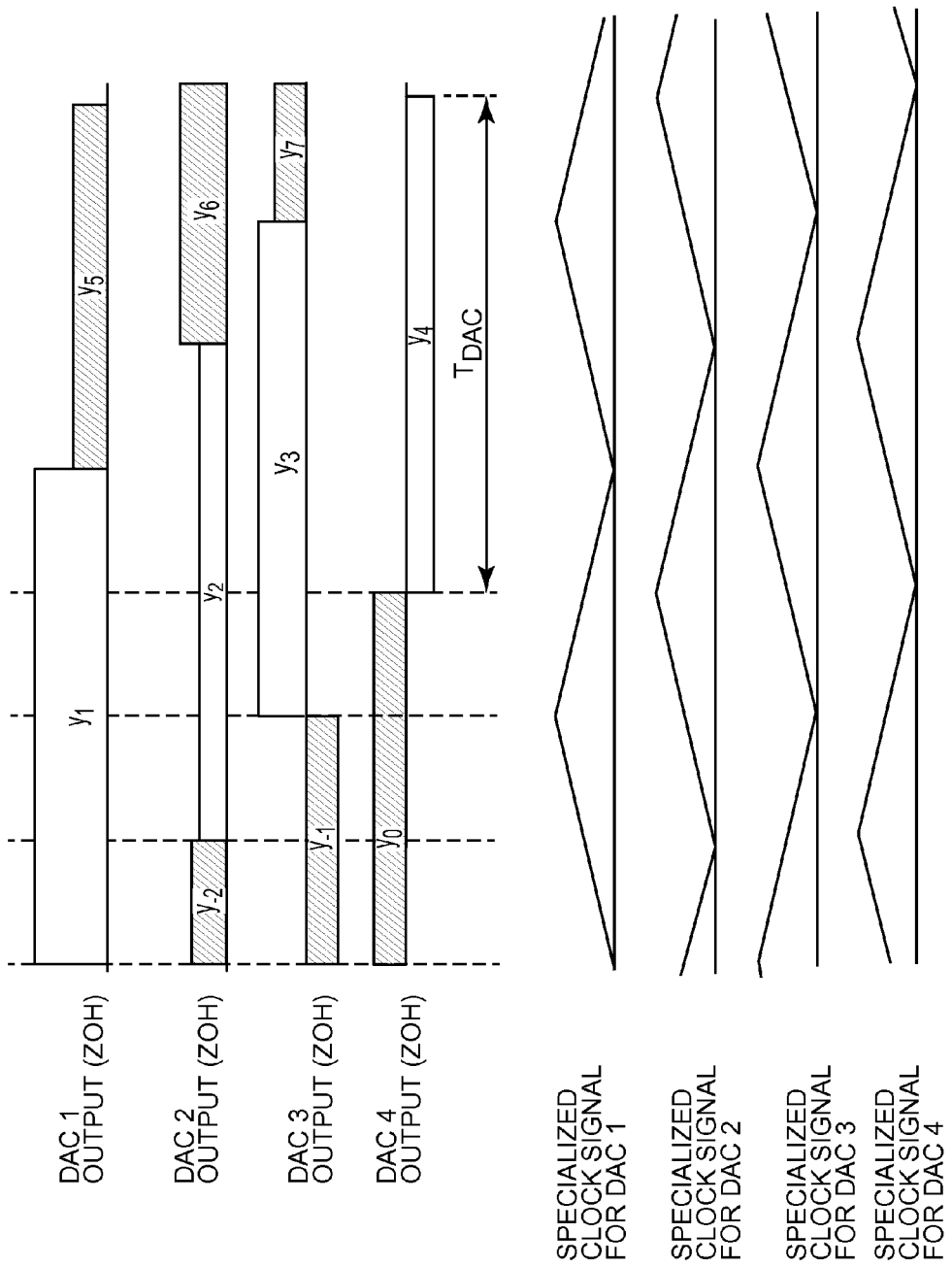

FIG. 4 illustrations a conventional DAC followed by an analog low-pass filter wherein interpolation is utilized to increase the spacing between the Nyquist images to thereby relax selectivity requirements of the analog low-pass filter;

FIGS. 5A through 5C illustrate exemplary outputs of a zero-order hold (ZOH), a first-order hold (FOH), and a second-order hold (SOH) DAC, respectively;

FIG. 6 illustrates a digital-to-analog conversion system that includes a DAC and a multiplier that multiplies an output of the DAC by a specialized clock signal to reshape an analog impulse response of the DAC such that Nyquist images resulting from digital-to-analog conversion are controlled in a desired manner according to one embodiment of the present disclosure;

FIG. 7 illustrates one example of a specialized clock signal used to reshape an analog impulse response of a DAC according to one embodiment of the present disclosure;

FIGS. 8A and 8B graphically illustrate the manner in which a frequency response of a DAC is modified by the specialized clock signal of FIG. 7 according to one embodiment of the present disclosure;

FIGS. 9A through 9D illustrate the specialized clock signal according to several additional exemplary embodiments of the present disclosure;

FIG. 10A illustrates one example of a digital input signal input into a DAC;

FIG. 10B illustrates the output of a ZOH DAC in response to the digital input signal of FIG. 10A;

FIG. 10C illustrates the modified output signal after application of the specialized clock signal according to one embodiment of the present disclosure;

FIG. 10D is a frequency domain representation of the modified output signal of FIG. 10C that illustrates the manner in which the application of the specialized clock signal modifies the frequency response of the DAC to control the Nyquist images in a desired manner according to one embodiment of the present disclosure;

FIG. 11 illustrates a digital-to-analog conversion system that includes a DAC and a variable gain amplifier that amplifies a specialized clock signal as a function of an output of the DAC in order to reshape an analog impulse response of the DAC such that Nyquist images resulting from digital-to-analog conversion are controlled in a desired manner according to another embodiment of the present disclosure;

FIG. 12 illustrates a digital-to-analog conversion system that includes a DAC and a variable gain amplifier that amplifies an output of the DAC as a function of a specialized clock signal in order to reshape an analog impulse response of the DAC such that Nyquist images resulting from digital-to-analog conversion are controlled in a desired manner according to another embodiment of the present disclosure;

FIG. 13 illustrates a system in which multiple DACs process streams of different samples of a primary digital signal and a specialized clock signal is applied to the outputs of the DACs in order to reshape an analog impulse response of each of the DACs such that Nyquist images resulting from digital-to-analog conversion are controlled in a desired manner according to another embodiment of the present disclosure;

FIG. 14 illustrates a polyphase structure in which multiple DACs process delayed and decimated versions of a primary digital signal and a specialized clock signal is applied to the outputs of the DACs in order to reshape an analog impulse response of each of the DACs such that Nyquist images resulting from digital-to-analog conversion are controlled in a desired manner according to another embodiment of the present disclosure; and FIG. 15 illustrates an example of the different delayed versions of the specialized clock signal applied to the outputs of the DACs of FIG. 14 according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a digital-to-analog conversion system that utilizes a specialized clock signal to reshape an analog impulse response of a digital-to-analog converter (DAC). Preferably, a shape of the specialized clock signal is such that Nyquist images resulting from digital-to-analog conversion are controlled in a desired manner. In this regard, FIG. 6 illustrates a digital-to-analog conversion system 18 according to one embodiment of the present disclosure. The digital-to-analog conversion system 18 includes a DAC 20 and an analog multiplier, or mixer, 22 connected as shown. In one embodiment, the DAC 20 is a zero-order hold (ZOH) DAC (i.e., a sample and hold DAC), but is not limited thereto. For example, the DAC 20 may alternatively be a first-order hold (FOH) DAC, a second-order hold (SOH) DAC, or the like.

In operation, the DAC 20 converts a digital input signal (d(n)) into an analog output signal ($\tilde{x}(t)$). The analog multiplier 22 then multiplies the analog output signal ($\tilde{x}(t)$) and a specialized clock signal to provide a modified, or final, analog output signal (x(t)). As used herein, the specialized clock signal is a clock signal having a non-conventional clock signal shape, where a non-conventional clock signal shape is e.g. a clock signal shape other than a rectangular clock signal shape, a sinusoidal wave clock signal shape, or the like, or some other conventional clock signal shape. In one preferred embodiment, the specialized clock signal is a periodic signal where: (1) each period of the specialized clock signal has a non-conventional clock signal shape (i.e., does not have a rectangular or sine wave shape), (2) each period of the specialized clock signal is equal to a sampling period of the DAC 20, and (3) the specialized clock signal is synchronized to a clock (CLK) of the DAC 20. Further, in the preferred embodiment, each period of the specialized clock signal is equal to a desired analog impulse response for the DAC 20.

By multiplying the analog output signal ($\tilde{x}(t)$) and the specialized clock signal, the analog multiplier 22 applies the specialized clock signal to the analog output signal ($\tilde{x}(t)$) such that an analog impulse response of the DAC 20 is reshaped according to the shape of the specialized clock signal. Further, the shape of the specialized clock signal is such that the analog impulse response of the DAC 20 is reshaped in such a manner as to control, in the frequency domain, Nyquist images resulting from the digital-to-analog conversion of the digital input signal (d(n)) in a desired manner. More specifically, the shape of the specialized clock signal is such that, in the frequency domain, one or more undesired Nyquist images are attenuated relative to the desired analog signal. The desired analog signal may be any one of the Nyquist images. Notably, as used herein, the Nyquist images are those images located at frequencies of 0, $f_S$, $2f_S$, $3f_S$, etc., where $f_S$ is a sampling rate of the DAC 20.

In one embodiment, the desired analog signal is at baseband, and each period of the specialized clock signal has a low-pass frequency response. In this manner, one or more of the undesired Nyquist images, and preferably all of the undesired Nyquist images, are attenuated relative to the desired analog signal at baseband. Similarly, in another embodiment, the desired analog signal is at baseband, and the specialized clock signal reshapes the analog impulse response of the DAC 20 to provide a reshaped, or effective, analog impulse response corresponding to a low-pass frequency response. In another embodiment, the desired analog signal is one of the Nyquist images located at a non-zero frequency (i.e., $f_S$, $2f_S$, or the like), and the specialized clock signal has a band-pass frequency response such that one or more of the undesired Nyquist images are attenuated relative to the desired Nyquist image. Similarly, in another embodiment, the desired analog signal is one of the Nyquist images located at a non-zero frequency, and the specialized clock signal reshapes the analog impulse response of the DAC 20 to provide a reshaped, or effective, analog response corresponding to a band-pass frequency response where the desired Nyquist image falls within the pass-band of the band-pass frequency response.

In yet another embodiment, the desired analog signal is at baseband, and each period of the specialized clock signal has a notch or multi-notch frequency response where the notch (es) is (are) centered on the undesired Nyquist image(s). In this manner, one or more of the undesired Nyquist images, and preferably all of the undesired Nyquist images, are attenuated relative to the desired analog signal at baseband. Similarly, in another embodiment, the desired analog signal is at baseband, and the specialized clock signal reshapes the analog impulse response of the DAC 20 to provide a reshaped, or effective, analog impulse response corresponding to a notch or multi-notch frequency response. The notch(es) is (are) centered on the undesired Nyquist images in the frequency domain. In another embodiment, the desired analog signal is one of the Nyquist images located at a non-zero frequency (i.e., $f_S$, $2f_S$, or the like), and the specialized clock signal has a notch or multi-notch frequency response where the notch(es) is (are) centered on the undesired Nyquist image(s). In this manner, one or more of the undesired Nyquist images, and preferably all of the undesired Nyquist images, are attenuated relative to the desired Nyquist image. Similarly, in another embodiment, the desired analog signal is one of the Nyquist images located at a non-zero frequency (i.e., $f_S$, $2f_S$, or the like), and the specialized clock signal reshapes the analog impulse response of the DAC 20 to provide a reshaped, or effective, analog impulse response corresponding to a notch or multi-notch frequency response. The notch(es) is (are) centered on the undesired Nyquist images in the frequency domain.

FIG. 7 illustrates one example of the specialized clock signal wherein each period of the specialized clock signal is a truncated sinc function. As illustrated, the specialized clock signal has a period that is equal to a sampling period of the DAC 20 ($T_{DAS}$) and is synchronized to the clock (CLK) of the DAC 20. The sinc function has a low-pass frequency response. As such, by applying the specialized clock signal of FIG. 7 to the analog output signal ($\tilde{x}(t)$), the analog impulse response of the DAC 20 is reshaped such that the reshaped, or effective, analog impulse response of the DAC 20 has a low-pass frequency response.

FIGS. 8A and 8B illustrate the manner in which the specialized clock signal of FIG. 7 reshapes the frequency response of the DAC 20. In this example, the DAC 20 is a ZOH DAC. More specifically, FIG. 8A illustrates the frequency response of the DAC 20 according to one embodiment. As illustrated, in the time domain, the output of the DAC 20 is a rectangular wave. As such, in the frequency domain, the frequency response of the DAC 20 is a sinc wave with nulls at integer multiples of the sampling rate ($f_S$) of the DAC 20. The sampling rate ($f_S$) of the DAC 20 is defined by the clock (CLK). More specifically, the sampling rate of the DAC 20 is equal to $1/T_{DAC}$, where $T_{DAC}$ is the sampling period of the DAC 20, and is defined by the clock (CLK). FIG. 8B illustrates the manner in which the frequency of the DAC 20 is reshaped according to the specialized clock signal of FIG. 7. As illustrated, the specialized clock signal widens a main lobe of the frequency response centered at DC (i.e., centered at frequency of 0), and decreases magnitudes of side lobes located at integer multiples of $f_S$.

Figure 9A:
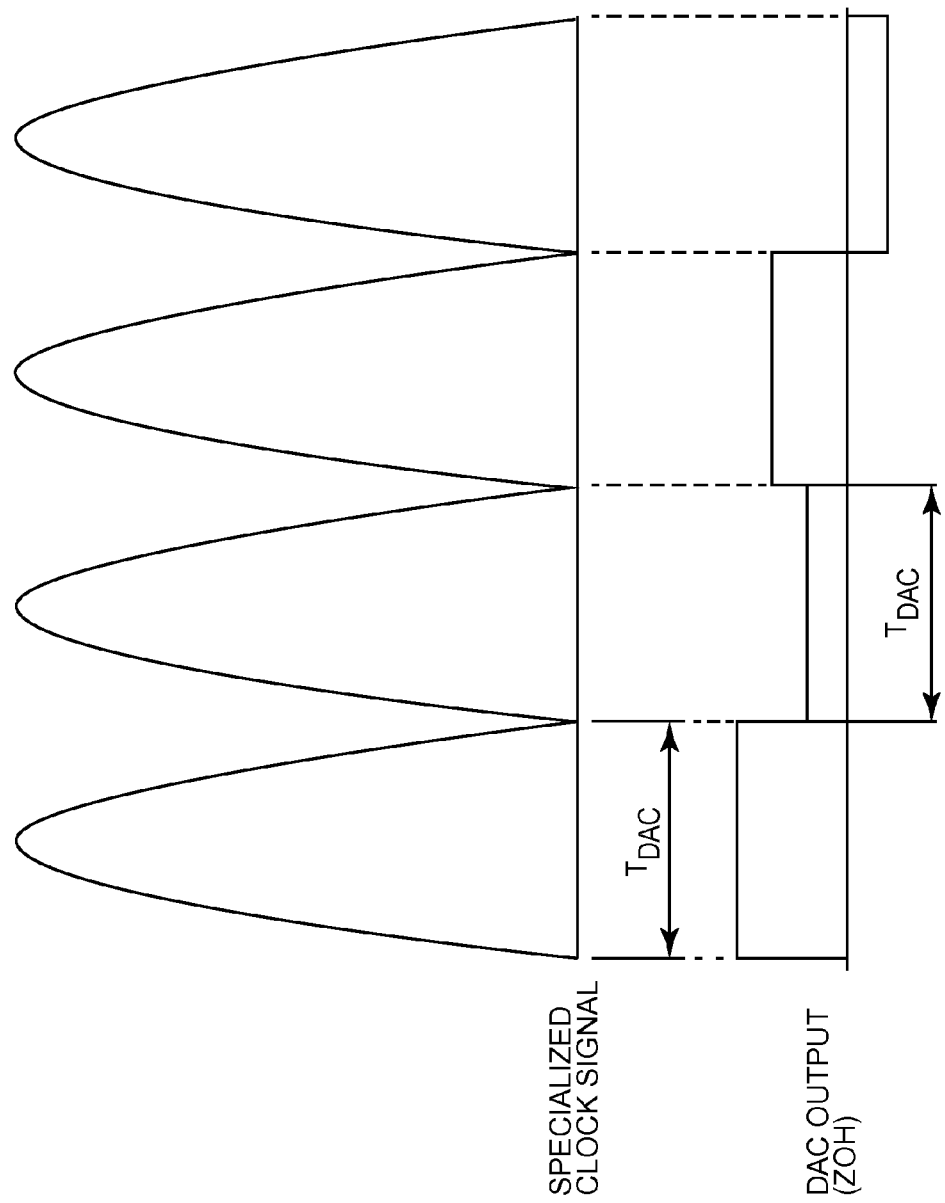
Figure 9C:
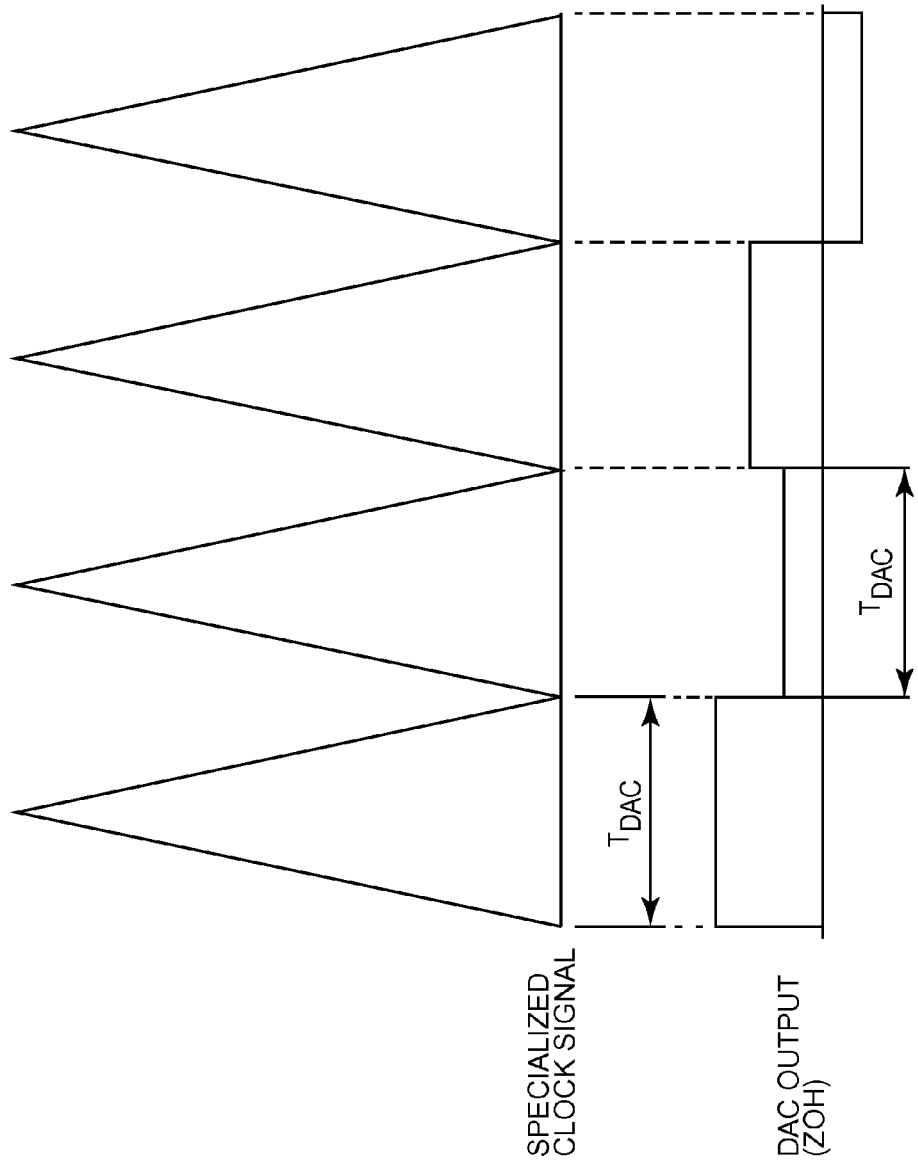
Figure 9D:
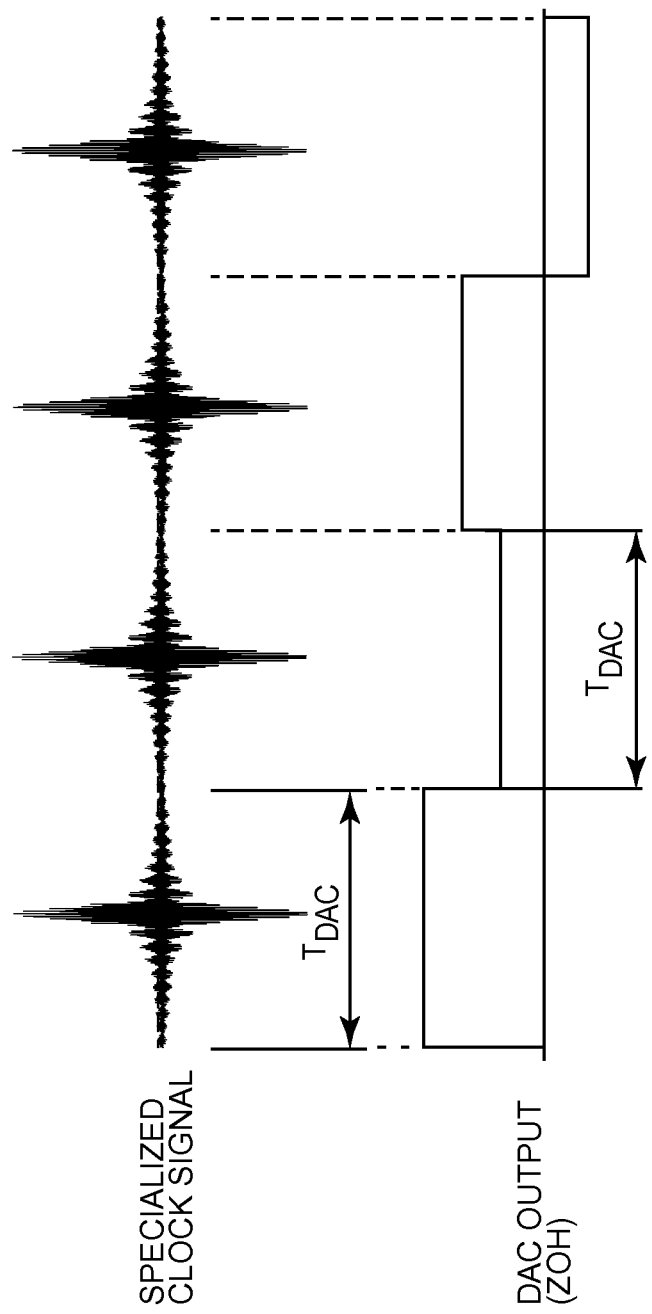

FIGS. 9A through 9D illustrate additional examples of the specialized clock signal. In FIG. 9A, each period of the specialized clock signal is a rectified sinusoid shaped clock signal. In FIG. 9B, each period of the specialized clock signal is a saw-tooth shaped clock signal. In FIG. 9C, each period of the specialized clock signal is a triangular-shaped clock signal. In FIG. 9D, each period of the specialized clock signal is a truncated sinc function modulated by a sine function at a desired frequency. The truncated sinc function has a low-pass frequency response. By modulating the truncated sinc function by the sine function at the desired frequency, the frequency response of the specialized clock signal becomes a band-pass frequency response with a pass-band at the desired frequency. The desired frequency is preferably the frequency of a desired Nyquist image. Note that other types of specialized clock signals having low-pass frequency responses may be modulated by a sine function at the desired frequency in order to create additional examples the specialized clock signal having a band-pass response. In each of the examples of FIGS. 9A through 9D, the period of the specialized clock signal is equal to the sampling period of the DAC 20 ($T_{DAC}$), and the specialized clock signal is synchronized to the clock (CLK) of the DAC 20.

Before proceeding, it should be noted that the examples of the specialized clock signal given above are only examples. Other shapes may be used. For example, each period of the specialized clock signal may be shaped according to a truncated sinc function, a rectified sinusoid function, a triangular function, a saw-tooth function, a Hann window, a Hamming window, a Tukey window, a cosine window, a Lanczos window, a Bartlett window, a Gaussian window, a Bartlett-Hann window, a Blackman window, a Kaiser window, a Nuttall window, a Blackman-Harris window, a Blackman-Nuttall window, a Flat top window, a Bessel window, a Dolph-Chebyshev window, a Hann-Poisson window, an Exponential window, a Rife-Vincent window, a Digital Prolate Spheriodal Sequence window, or the like. In the field of Finite Impulse Response (FIR) filter design, there are many techniques that are used to approximate some desired frequency response using a finite duration impulse response. Any such technique may be used to provide the specialized clock signal where each period of the specialized clock signal is a finite duration impulse response having a desired frequency response. While not essential, for more information regarding signal processing windows that may be used as the shape for the periods of the specialized clock signal, the interested reader is directed to, for example, section 8.2 or 8.5 of J. G. Proakis et al., "Digital Signal Processing, Principles, Algorithms, and Applications," $3^{rd}$ Edition, Prentice-Hall, 1996, which are hereby incorporated herein by reference in their entireties.

In addition, while in the examples above there is only one waveform per period, the specialized clock signal may alternatively include multiple waveforms per period. For example, each period of the specialized clock signal may alternatively include multiple repeating waveforms or windows. As some examples, each period of the specialized clock signal may include two or more repeating truncated sinc functions, two or more repeating rectified sinusoid functions, two or more repeating triangular functions, two or more repeating saw-tooth functions, two or more repeating Hann windows, two or more repeating Hamming windows, two or more repeating Tukey windows, two or more repeating cosine windows, two or more repeating Lanczos windows, two or more repeating Bartlett windows, two or more repeating Gaussian windows, two or more repeating Bartlett-Hann windows, two or more repeating Blackman windows, two or more repeating Kaiser windows, two or more repeating Nuttall windows, two or more repeating Blackman-Harris windows, two or more repeating Blackman-Nuttall windows, two or more repeating Flat top windows, two or more repeating Bessel windows, two or more repeating Dolph-Chebyshev windows, two or more repeating Hann-Poisson windows, two or more repeating Exponential windows, two or more repeating Rife-Vincent windows, two or more repeating Digital Prolate Spheriodal Sequence windows, or the like.

It should also be noted that while many of the examples of the specialized clock signal given above modify the analog impulse response of the DAC 20 to provide a low-pass for band-pass frequency response, the specialized clock signal is not limited thereto. In another embodiment, the specialized clock signal may be provided to reshape the impulse response of the DAC 20 such that, in the frequency domain, stop-bands are provided only at the frequencies occupied by undesired Nyquist images. This approach may be well suited for low-order FIR responses when the digital input signal (d(n)) is oversampled. In another embodiment, the specialized clock signal may be provided such that the notches, or nulls, in the ZOH DAC response are moved away from a desired image.

FIGS. 10A through 10D graphically illustrate the operation of the digital-to-analog conversion system 18 for one example of the digital input signal (d(n)) according to one embodiment of the present disclosure. More specifically, FIG. 10A illustrates input sample impulses that represent one example of the digital input signal (d(n)) that is input into the DAC 20. FIG. 10B illustrates both the input sample impulses of FIG. 10A and the analog output signal ($\tilde{x}(t)$) output by the DAC 20, where in this example the DAC 20 is a ZOH DAC. FIG. 10C illustrates the input sample impulses of FIG. 10A, the analog output signal ($\tilde{x}(t)$) of FIG. 10B, and the corresponding modified analog output signal (x(t)) along with an ideal analog signal. The ideal signal is the desired image with all of the undesired images completely removed. In this example, the specialized clock signal applied to the analog output signal ($\tilde{x}(t)$) to reshape the analog impulse response of the DAC 20 is a rectified sinusoid. Lastly, FIG. 10D illustrates a frequency domain representation of the analog output signal ($\tilde{x}(t)$), the modified analog output signal (x(t)), and the ideal analog signal. In this example, the specialized clock signal has a band-pass response such that the Nyquist image in the first Nyquist zone is attenuated and the Nyquist image in the second Nyquist zone is enhanced, or increased in magnitude.

FIG. 11 illustrates the digital-to-analog conversion system 18 according to another embodiment of the present disclosure. This embodiment is the same as that of FIG. 6 but where a variable gain amplifier (VGA) 24, rather than the analog multiplier 22 (FIG. 6), applies the specialized clock signal to the analog output signal ($\tilde{x}(t)$) output by the DAC 20. More specifically, the VGA 24 amplifies the specialized clock signal as a function of the analog output signal ($\tilde{x}(t)$) output by the DAC 20. Like the analog multiplier 22 (FIG. 6), the VGA 24 multiplies the specialized clock signal and the analog output signal ($\tilde{x}(t)$) together, but, by the nature of the VGA 24, the operating bandwidth of the inputs is not the same, and it may be advantageous to use one input over the other for either the analog output signal ($\tilde{x}(t)$) output by the DAC 20 or the specialized clock signal.

FIG. 12 illustrates the digital-to-analog conversion system 18 according to another embodiment of the present disclosure. This embodiment is substantially the same as that of FIG. 11. However, in this embodiment, the inputs of the VGA 24 are reversed. More specifically, the VGA 24 amplifies the analog output signal ($\tilde{x}(t)$) output by the DAC 20 as a function of the specialized clock signal. Like the analog multiplier 22 (FIG. 6), the VGA 24 multiplies the specialized clock signal and the analog output signal ($\tilde{x}(t)$) together, but, by the nature of the VGA 24, the operating bandwidth of the inputs is not the same, and it may be advantageous to use one input over the other for either the analog output signal ($\tilde{x}(t)$) output by the DAC 20 or the specialized clock signal.

It will be understood by those skilled in the art that the VGA 24 in the context of the present disclosure is a generalized representation of a two input device that scales one input based on the signal presented to the other input and that there are multiple alternative means by which such scaling, or multiplication, can occur. The VGA 24 is to be understood as a specialized form of multiplier in which the inputs are not symmetric in the frequencies of operation (i.e., one input typically has a much lower bandwidth than the other), the limiting bandwidth of which is not a limitation to on the scope of the present disclosure.

FIG. 13 illustrates a digital-to-analog conversion system 26 according to another embodiment of the present disclosure. In this embodiment, the digital-to-analog conversion system 26 includes a number of DACs 28-1 through 28-N, where N is greater than or equal to 2. A primary digital signal is split into N streams of different digital samples that are input to respective ones of the DACs 28-1 through 28-N, which are referred to as digital input signals $d_1(n)$ through $d_N(n)$, respectively. For example, if N=4, then samples 0, 4, 8, etc. may be provided as the first digital input signal ($d_1(n)$) that is input to the DAC 28-1, samples 1, 5, 9, etc. may be provided as the second digital input signal ($d_2(n)$) that is input to the DAC 28-2, samples 2, 6, 10, etc. may be provided as the third digital input signal ($d_3(n)$) that is input to the DAC 28-3, and samples 3, 7, 11, etc. may be provided as a fourth digital input signal ($d_4(n)$) that is input to the DAC 28-4. In this manner, the sampling rate of each of the digital input signals $d_1(n)$ through $d_N(N)$ is N times less than the sampling rate of the primary digital signal. As a result, sampling periods of the DACs 28-1 through 28-N are N times longer than a sampling period that would be needed if a single DAC were to convert the primary digital signal.

A specialized clock signal is applied to the analog output signals ($\tilde{x}_1(t)$ through $\tilde{x}_N(t)$) output by the DACs 28-1 through 28-N by multipliers 30-1 through 30-N in the manner described above. In general, the specialized clock signal input into the multipliers 30-1 through 30-N are aligned in time and/or magnitude in such way to allow the reconstruction of a desired final analog output signal (x(t)) at an output of summation, or combiner, circuitry 32. In one particular embodiment, a phase or delay of the specialized clock signal input to each of the multipliers 28-1 through 28-N is adjusted in order to synchronize the specialized clock signal with the clock of the corresponding DAC 28. In this manner, the specialized clock signals for each of the multipliers 28-1 through 28-N are offset in time with respect to one another. The longer sampling periods of the DACs 28-1 through 28-N enable longer periods for the specialized clock signal, which in turn enables more precise control of the Nyquist images in the frequency domain. Lastly, modified analog output signals ($x_1(t)$ through $x_N(t)$) output by the multipliers 30-1 through 30-N are combined by summation, or combiner, circuitry 32 to provide a final analog output signal (x(t)). Notably, while the multipliers 30-1 through 30-N are used in this embodiment, the multipliers 30-1 through 30-N may be replaced with VGAs in the manner described above with respect to FIGS. 11 and 12.

FIG. 14 illustrates a digital-to-analog conversion system 34 according to another embodiment of the present disclosure. In this embodiment, the digital-to-analog conversion system 34 is a polyphase structure including a number (N) of polyphase branches. The N polyphase branches include decimators 36-1 through 36-N, DACs 38-1 through 38-N, and multipliers 40-1 through 40-N, respectively, connected as shown. A primary digital input signal (d(n)) is passed through a series of delays 42-1 through 42-(N−1) to provide corresponding digital input signals ($d_1(n)$ through $d_N(n)$) to the N polyphase branches. Preferably, each of the delays 42-1 through 42-(N−1) delays the primary digital input signal (d(n)) by $T_{S,IN}$, where $T_{S,IN}=1/f_{S,IN}$ and $f_{S,IN}$ is a sampling rate of the primary digital input signal (d(n)).

The decimators 36-1 through 36-N decimate the digital input signals ($d_1(n)$ through $d_N(n)$), respectively, by a desired decimation factor (D) to provide decimated digital input signals ($d_1'(n)$ through $d_N'(n)$) each having a sampling rate equal to $f_{S,IN}/D$, where again $f_{S,IN}$ is the sampling rate of the primary digital input signal (d(n)). Preferably, the decimation factor (D) is equal to the number (N) of polyphase branches (i.e., D=N). The decimated digital input signals ($d_1'(n)$ through $d_N'(n)$) are digital-to-analog converted by the DACs 38-1 through 38-N to provide corresponding analog output signals ($\tilde{x}_1(t)$ through $\tilde{x}_N(t)$). As a result of decimation, a sampling period of each of the DACs 38-1 through 38-N is D times longer than a sampling period of the primary digital signal (d(n)), which is a sampling period that would be required if a single DAC were to be used to convert the primary digital input signal (d(n)).

A specialized clock signal is applied to the analog output signals ($\tilde{x}_1(t)$ through $\tilde{x}_N(t)$) output by the DACs 38-1 through 38-N by the multipliers 40-1 through 40-N in the manner described above. However, in this embodiment, a phase or delay of the specialized clock signal input to each of the multipliers 40-1 through 40-N is adjusted in order to synchronize the specialized clock signal with the clock of the corresponding DAC 38. Specifically, in one preferred embodiment, each of the delays 42-1 through 42-(N−1) applies a delay of $T_{S,IN}$, where again $T_{S,IN}$ is equal to $1/f_{S,IN}$ and $f_{S,IN}$ is the sampling rate of the primary digital input signal (d(n)). As such, the digital input signal $d_i(n)$ for the i-th polyphase branch (where i=1 . . . N) is delayed by an amount of time equal to $(i-1) \times T_{S,IN}$. The phase offset, or delay, of the specialized clock signal for the i-th polyphase branch corresponds to the delay for the corresponding digital input signal ($d_i(n)$), which is equal to $(i-1) \times T_{S,IN}$. As discussed above, due to the polyphase structure and decimation, the sampling period ($T_{DAC}$) of the DACs 38-1 through 38-N is D times longer than the sampling period $T_{S,IN}$ of the primary digital input signal (d(n)). The longer sampling period ($T_{DAC}$) of the DACs 38-1 through 38-N enable longer periods for the specialized clock signal, which in turn enables more precise control of the Nyquist images in the frequency domain. Lastly, modified analog output signals ($x_1(t)$ through $x_N(t)$) output by the multipliers 40-1 through 40-N are combined by summation, or combiner, circuitry 44 to provide a final analog output signal (x(t)). Notably, while the multipliers 40-1 through 40-N are used in this embodiment, the multipliers 40-1 through 40-N may be replaced with VGAs in the manner described above with respect to FIGS. 11 and 12.

FIG. 15 illustrates one example of the specialized clock signal and corresponding phase offsets applied to the analog output signals ($\tilde{x}_1(t)$ through $\tilde{x}_N(t)$) output by the DACs 38-1 through 38-N according to one embodiment of the present disclosure. In this example, there are 4 polyphase branches. As illustrated, the delay for the specialized clock signal applied to the analog output signal $\tilde{x}_1(t)$ is 0, the delay for the specialized clock signal applied to the analog output signal $\tilde{x}_2(t)$ is $T_{DAC}/4$ (which is equal to delay $T_{S,IN}$ for the digital input signal $d_2(n)$), the delay for the specialized clock signal applied to the analog output signal $\tilde{x}_3(t)$ is $T_{DAC}/2$ (which is equal to delay $2T_{S,IN}$ for the digital input signal $d_3(n)$), and the delay for the specialized clock signal applied to the analog output signal $\tilde{x}_4(t)$ is $3T_{DAC}/4$ (which is equal to delay $3T_{S,IN}$ for the digital input signal $d_4(n)$). In this manner, for each polyphase branch of the polyphase structure of FIG. 14, the specialized clock signal is synchronized to the clock of the corresponding DAC 38.

The following acronyms are used throughout this disclosure.

DAC Digital-to-Analog Converter
FIR Finite Impulse Response
FOH First-Order Hold
IMD Intermodulation Distortion
RF Radio Frequency
SOH Second-Order Hold VGA Variable Gain Amplifier
ZOH Zero-Order Hold Those skilled in the art will recognize improvements and modifications to the preferred embodiments of the present disclosure. All such improvements and modifications are considered within the scope of the concepts disclosed herein and the claims that follow.

What is claimed is:

1. A system comprising:
a digital-to-analog converter configured to convert a digital input signal into an analog output signal; and
circuitry configured to apply a specialized clock signal to the analog output signal to provide a modified analog output signal.

2. The system of claim 1 wherein the specialized clock signal reshapes an analog impulse response of the digital-to-analog converter such that one or more Nyquist images of the digital input signal that result from digital-to-analog conversion of the digital input signal by the digital-to-analog converter are controlled in a desired manner.

3. The system of claim 1 wherein the specialized clock signal reshapes an analog impulse response of the digital-to-analog converter such that one or more undesired Nyquist images of the digital input signal that result from digital-to-analog conversion of the digital input signal by the digital-to-analog converter are attenuated.

4. The system of claim 1 wherein the specialized clock signal is a periodic signal that has a period that is equal to a sampling period of the digital-to-analog converter and is synchronized to a clock of the digital-to-analog converter.

5. The system of claim 4 wherein each period of the specialized clock signal has a low-pass frequency response.

6. The system of claim 4 wherein each period of the specialized clock signal has a band-pass frequency response.

7. The system of claim 4 wherein each period of the specialized clock signal has a notch frequency response.

8. The system of claim 4 wherein each period of the specialized clock signal has a multi-notch frequency response.

9. The system of claim 4 wherein each period of the specialized clock signal is shaped according to one of a group consisting of: a truncated sinc function, a rectified sinusoid function, a triangular function, a saw-tooth function, a Hann window, a Hamming window, a Tukey window, a cosine window, a Lanczos window, a Bartlett window, a Gaussian window, a Bartlett-Hann window, a Blackman window, a Kaiser window, a Nuttall window, a Blackman-Harris window, a Blackman-Nuttall window, a Flat top window, a Bessel window, a Dolph-Chebyshev window, a Hann-Poisson window, an Exponential window, a Rife-Vincent window, and a Digital Prolate Spheriodal Sequence window.

10. The system of claim 4 wherein each period of the specialized clock signal is shaped according to multiple repeating window functions.

11. The system of claim 10 wherein each period of the specialized clock signal is shaped according to multiple repeating window functions selected from a group consisting of: two or more repeating truncated sinc functions, two or more repeating rectified sinusoid functions, two or more repeating triangular functions, two or more repeating saw-tooth functions, two or more repeating Hann windows, two or more repeating Hamming windows, two or more repeating Tukey windows, two or more repeating cosine windows, two or more repeating Lanczos windows, two or more repeating Bartlett windows, two or more repeating Gaussian windows, two or more repeating Bartlett-Hann windows, two or more repeating Blackman windows, two or more repeating Kaiser windows, two or more repeating Nuttall windows, two or more repeating Blackman-Harris windows, two or more repeating Blackman-Nuttall windows, two or more repeating Flat top windows, two or more repeating Bessel windows, two or more repeating Dolph-Chebyshev windows, two or more repeating Hann-Poisson windows, two or more repeating Exponential windows, two or more repeating Rife-Vincent windows, and two or more repeating Digital Prolate Spheriodal Sequence windows.

12. The system of claim 4 wherein the circuitry comprises a multiplier configured to multiply the analog output signal and the specialized clock signal to provide the modified analog output signal.

13. The system of claim 4 wherein the circuitry comprises a variable gain amplifier configured to amplify the analog output signal as a function of the specialized clock signal to provide the modified analog output signal.

14. The system of claim 4 wherein the circuitry comprises a variable gain amplifier configured to amplify the specialized clock signal as a function of the analog output signal to provide the modified analog output signal.

15. The system of claim 4 wherein the digital-to-analog converter is a zero-order hold digital-to-analog converter.

16. The system of claim 1 further comprising:
a plurality of digital-to-analog converters, including the digital-to-analog converter, configured to convert a plurality of digital input signals into a plurality of analog output signals, wherein the circuitry is further configured to apply the specialized clock signal to each of the plurality of analog output signals to provide a plurality of modified analog output signals; and
combiner circuitry configured to combine the plurality of modified analog output signals to provide a combined analog output signal.

17. The system of claim 16 wherein the plurality of digital input signals is a number, N, of streams of different digital samples from a primary digital input signal, and a sampling period of each of the plurality of digital-to-analog converters is equal to N divided by a sampling rate of the primary digital input signal.

18. The system of claim 17 wherein, for each analog output signal of the plurality of analog output signals, the specialized clock signal applied to the analog output signal by the circuitry is periodic and has a period that is equal to the sampling period of each of the plurality of digital-to-analog converters and is synchronized to a clock of a corresponding one of the plurality of digital-to-analog converters.

19. The system of claim 17 wherein the circuitry comprises a plurality of multipliers, each multiplier of the plurality of multipliers configured to multiply the specialized clock signal and a different one of the plurality of analog output signals to provide a corresponding one of the plurality of modified analog output signals.

20. The system of claim 19 wherein, for each multiplier of the plurality of multipliers, the specialized clock signal is periodic and has a period that is equal to the sampling period of each of the plurality of digital-to-analog converters and is synchronized to a clock of a corresponding one of the plurality of digital-to-analog converters.

21. The system of claim 17 wherein the circuitry comprises a plurality of variable gain amplifiers, each variable gain amplifier of the plurality of variable gain amplifiers configured to amplify the specialized clock signal as a function of a different one of the plurality of analog output signals to provide a corresponding one of the plurality of modified analog output signals.

22. The system of claim 21 wherein, for each variable gain amplifier of the plurality of variable gain amplifiers, the specialized clock signal is periodic and has a period that is equal to the sampling period of each of the plurality of digital-to-analog converters and is synchronized to a clock of a corresponding one of the plurality of digital-to-analog converters.

23. The system of claim 17 wherein the circuitry comprises a plurality of variable gain amplifiers, each variable gain amplifier of the plurality of variable gain amplifiers configured to amplify a different one of the plurality of analog output signals as a function of the specialized clock signal to provide a corresponding one of the plurality of modified analog output signals.

24. The system of claim 23 wherein, for each variable gain amplifier of the plurality of variable gain amplifiers, the specialized clock signal is periodic and has a period that is equal to the sampling period of each of the plurality of digital-to-analog converters and is synchronized to a clock of a corresponding one of the plurality of digital-to-analog converters.

25. The system of claim 17 wherein each period of the specialized clock signal has a low-pass frequency response.

26. The system of claim 17 wherein each period of the specialized clock signal has a band-pass frequency response.

27. The system of claim 17 wherein each period of the specialized clock signal has a notch frequency response.

28. The system of claim 17 wherein each period of the specialized clock signal has a multi-notch frequency response.

29. The system of claim 17 wherein each period of the specialized clock signal is shaped according to one of a group consisting of: a truncated sinc function, a rectified sinusoid function, a triangular function, a saw-tooth function, a Hann window, a Hamming window, a Tukey window, a cosine window, a Lanczos window, a Bartlett window, a Gaussian window, a Bartlett-Hann window, a Blackman window, a Kaiser window, a Nuttall window, a Blackman-Harris window, a Blackman-Nuttall window, a Flat top window, a Bessel window, a Dolph-Chebyshev window, a Hann-Poisson window, an Exponential window, a Rife-Vincent window, and a Digital Prolate Spheriodal Sequence window.

30. The system of claim 17 wherein each period of the specialized clock signal is shaped according to multiple repeating window functions.

31. The system of claim 30 wherein each period of the specialized clock signal is shaped according to multiple repeating window functions selected from a group consisting of: two or more repeating truncated sinc functions, two or more repeating rectified sinusoid functions, two or more repeating triangular functions, two or more repeating saw-tooth functions, two or more repeating Hann windows, two or more repeating Hamming windows, two or more repeating Tukey windows, two or more repeating cosine windows, two or more repeating Lanczos windows, two or more repeating Bartlett windows, two or more repeating Gaussian windows, two or more repeating Bartlett-Hann windows, two or more repeating Blackman windows, two or more repeating Kaiser windows, two or more repeating Nuttall windows, two or more repeating Blackman-Harris windows, two or more repeating Blackman-Nuttall windows, two or more repeating Flat top windows, two or more repeating Bessel windows, two or more repeating Dolph-Chebyshev windows, two or more repeating Hann-Poisson windows, two or more repeating Exponential windows, two or more repeating Rife-Vincent windows, and two or more repeating Digital Prolate Spheriodal Sequence windows.

32. A method comprising:
converting a digital input signal into an analog output signal via a digital-to-analog converter; and
applying a specialized clock signal to the analog output signal to provide a modified analog output signal.

33. A system comprising:
a polyphase structure comprising a number, N, of polyphase branches, wherein each i-th polyphase branch of the number, N, of polyphase branches where i=1, ..., N of the polyphase structure comprises:
decimation circuitry configured to decimate a version of a digital input signal delayed by $(i-1) \times T_{S,IN}$ by a decimation factor, D where D is equal to N, to provide a decimated digital input signal for the i-th polyphase branch having a sampling rate of $f_{S,IN}/D$, where $T_{S,IN}$ is equal to $1/f_{S,IN}$ and $f_{S,IN}$ is a sampling rate of the digital input signal;
a digital-to-analog converter configured to convert the decimated digital input signal for the i-th polyphase branch into an analog output signal for the i-th polyphase branch, the digital-to-analog converter having a sampling period of $T_{S,IN} \times D$; and
circuitry configured to apply a specialized clock signal to the analog output signal for the i-th polyphase branch to provide a modified analog output signal for the i-th polyphase branch, the specialized clock signal being a periodic signal having a period that is equal to the sampling period of the digital-to-analog converter and being synchronized to a clock of the digital-to-analog converter; and
combiner circuitry configured to combine the modified analog output signals from the number, N, of polyphase branches to provide a final analog output signal.

34. The system of claim 33 wherein the specialized clock signal for the number, N, of polyphase branches is the same specialized clock signal having a time offset that corresponds to the delay, $(i-1) \times T_{S,IN}$, for the corresponding polyphase branch i.

35. The system of claim 33 wherein, for each i-th polyphase branch of the number, N, of polyphase branches, the circuitry comprises a multiplier configured to multiply the specialized clock signal and the analog output signal for the i-th polyphase branch to provide the modified analog output signal for the i-th polyphase branch.

36. The system of claim 33 wherein, for each i-th polyphase branch of the number, N, of polyphase branches, the circuitry comprises a variable gain amplifier configured to amplify the specialized clock signal as a function of the analog output signal for the i-th polyphase branch to provide the modified analog output signal for the i-th polyphase branch.

37. The system of claim 33 wherein, for each i-th polyphase branch of the number, N, of polyphase branches, the circuitry comprises a variable gain amplifier configured to amplify the analog output signal output for the i-th polyphase branch as a function of the specialized clock signal to provide the modified analog output signal for the i-th polyphase branch.

38. The system of claim 33 wherein, for each i-th polyphase branch of the number, N, of polyphase branches, each period of the specialized clock signal has a low-pass frequency response.

39. The system of claim 33 wherein, for each i-th polyphase branch of the number, N, of polyphase branches, each period of the specialized clock signal has a band-pass frequency response.

40. The system of claim 33 wherein, for each i-th polyphase branch of the number, N, of polyphase branches, each period of the specialized clock signal has a notch frequency response.

41. The system of claim 33 wherein, for each i-th polyphase branch of the number, N, of polyphase branches, each period of the specialized clock signal has a multi-notch frequency response.

42. The system of claim 33 wherein, for each i-th polyphase branch of the number, N, of polyphase branches, each period of the specialized clock signal is shaped according to one of a group consisting of: a truncated sinc function, a rectified sinusoid function, a triangular function, a sawtooth function, a Hann window, a Hamming window, a Tukey window, a cosine window, a Lanczos window, a Bartlett window, a Gaussian window, a Bartlett-Hann window, a Blackman window, a Kaiser window, a Nuttall window, a Blackman-Harris window, a Blackman-Nuttall window, a Flat top window, a Bessel window, a Dolph-Chebyshev window, a Hann-Poisson window, an Exponential window, a Rife-Vincent window, and a Digital Prolate Spheriodal Sequence window.

43. The system of claim 33 wherein, for each i-th polyphase branch of the number, N, of polyphase branches, each period of the specialized clock signal is shaped according to multiple repeating window functions.

44. The system of claim 43 wherein, for each i-th polyphase branch of the number, N, of polyphase branches, each period of the specialized clock signal is shaped according to multiple repeating window functions selected from a group consisting of: two or more repeating truncated sinc functions, two or more repeating rectified sinusoid functions, two or more repeating triangular functions, two or more repeating saw-tooth functions, two or more repeating Hann windows, two or more repeating Hamming windows, two or more repeating Tukey windows, two or more repeating cosine windows, two or more repeating Lanczos windows, two or more repeating Bartlett windows, two or more repeating Gaussian windows, two or more repeating Bartlett-Hann windows, two or more repeating Blackman windows, two or more repeating Kaiser windows, two or more repeating Nuttall windows, two or more repeating Blackman-Harris windows, two or more repeating Blackman-Nuttall windows, two or more repeating Flat top windows, two or more repeating Bessel windows, two or more repeating Dolph-Chebyshev windows, two or more repeating Hann-Poisson windows, two or more repeating Exponential windows, two or more repeating Rife-Vincent windows, and two or more repeating Digital Prolate Spheriodal Sequence windows.

* * * * *